United States Patent
Yuan et al.

(10) Patent No.: US 12,347,379 B2
(45) Date of Patent: Jul. 1, 2025

(54) PIXEL CIRCUIT AND DRIVING METHOD THEREOF, AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Zhidong Yuan, Beijing (CN); Pan Xu, Beijing (CN); Yongqian Li, Beijing (CN); Can Yuan, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/554,822

(22) PCT Filed: Jan. 12, 2023

(86) PCT No.: PCT/CN2023/071892
§ 371 (c)(1),
(2) Date: Oct. 11, 2023

(87) PCT Pub. No.: WO2024/087402
PCT Pub. Date: May 2, 2024

(65) Prior Publication Data
US 2025/0061851 A1 Feb. 20, 2025

(30) Foreign Application Priority Data
Oct. 28, 2022 (WO) ............... PCT/CN2022/128241
Oct. 28, 2022 (WO) ............... PCT/CN2022/128244
Oct. 28, 2022 (WO) ............... PCT/CN2022/128272

(51) Int. Cl.
*G09G 3/3233* (2016.01)
*G09G 3/3208* (2016.01)
*G09G 3/3258* (2016.01)

(52) U.S. Cl.
CPC ......... *G09G 3/3233* (2013.01); *G09G 3/3208* (2013.01); *G09G 3/3258* (2013.01);
(Continued)

(58) Field of Classification Search
CPC .. G09G 3/3233; G09G 3/3208; G09G 3/3258; G09G 2300/0804;
(Continued)

(56) References Cited

U.S. PATENT DOCUMENTS 11,074,864 B1  7/2021 Lu et al.
2014/0111503 A1*  4/2014 Kwon ............... G09G 3/3233
                                                345/82
(Continued)

FOREIGN PATENT DOCUMENTS

CN  101630479 A  1/2010
CN  102842283 A  12/2012
(Continued)

OTHER PUBLICATIONS

Chang Tianhai et al., Study on the Display Apparatus of OLED's Driving Circuit, Guangdong Vacuum Society 2011, pp. 71-76.
(Continued)

*Primary Examiner* — Tom V Sheng
(74) *Attorney, Agent, or Firm* — Dilworth & Barrese, LLP.; Michael J. Musella, Esq.

(57) ABSTRACT

A pixel circuit and a driving method thereof, and a display device are disclosed. The pixel circuit includes a driving circuit, a data writing circuit, a reset circuit, a light-emitting control circuit and a light-emitting element. The driving circuit includes a control terminal, a first terminal and a
(Continued)

second terminal; the data writing circuit is connected to a first node to apply a data voltage; the reset circuit is connected to the first node to apply a reference voltage. The pixel circuit further includes a partition control circuit, which is connected to the first node and the control terminal, and is configured to apply the data voltage and the reference voltage to the control terminal; the reset circuit is connected to one of the first terminal and the second terminal of the driving circuit, and the reset circuit is further configured to apply an initialization voltage to the driving circuit.

20 Claims, 13 Drawing Sheets

(52) U.S. Cl.
CPC ............... *G09G 2300/0804* (2013.01); *G09G 2300/0819* (2013.01); *G09G 2300/0852* (2013.01); *G09G 2300/0861* (2013.01); *G09G 2310/08* (2013.01); *G09G 2320/0204* (2013.01); *G09G 2320/0233* (2013.01); *G09G 2320/043* (2013.01); *G09G 2320/045* (2013.01)

(58) Field of Classification Search
CPC ... G09G 2300/0819; G09G 2300/0852; G09G 2300/0861; G09G 2310/08; G09G 2320/0204; G09G 2320/045; G09G 2320/043; G09G 2320/0233
USPC .......................................................... 345/55
See application file for complete search history.

(56) References Cited

U.S. PATENT DOCUMENTS

| | | | |
|---|---|---|---|
| 2016/0210898 A1* | 7/2016 | Tsuge | G09G 3/3233 |
| 2018/0151115 A1* | 5/2018 | Tseng | G09G 3/3233 |
| 2018/0357964 A1 | 12/2018 | Shin et al. | |
| 2019/0051243 A1 | 2/2019 | Li et al. | |
| 2019/0130842 A1* | 5/2019 | Jang | G09G 3/3266 |
| 2020/0234649 A1 | 7/2020 | Fan et al. | |
| 2020/0243023 A1* | 7/2020 | Fan | G09G 5/10 |
| 2021/0057450 A1 | 2/2021 | Wu et al. | |
| 2021/0065619 A1* | 3/2021 | Kim | G09G 3/3233 |
| 2021/0091161 A1 | 3/2021 | Baek et al. | |
| 2021/0183977 A1 | 6/2021 | Xiao et al. | |
| 2021/0257440 A1 | 8/2021 | Long et al. | |
| 2021/0328002 A1 | 10/2021 | Lee et al. | |
| 2021/0375213 A1* | 12/2021 | Gao | G09G 3/3233 |
| 2021/0407386 A1* | 12/2021 | Li | H01L 27/124 |
| 2022/0051633 A1* | 2/2022 | Li | G09G 3/3266 |
| 2022/0068182 A1 | 3/2022 | Lee et al. | |
| 2022/0139307 A1* | 5/2022 | Zhang | G09G 3/3233 345/204 |
| 2022/0157856 A1 | 5/2022 | Choung et al. | |
| 2022/0284860 A1* | 9/2022 | Lin | G09G 3/3266 |
| 2023/0005421 A1 | 1/2023 | Sakaguchi et al. | |
| 2023/0021680 A1 | 1/2023 | Li et al. | |
| 2023/0081342 A1* | 3/2023 | Lin | H10K 59/126 345/211 |
| 2023/0196975 A1 | 6/2023 | Zong et al. | |
| 2023/0290305 A1* | 9/2023 | Kwon | G09G 3/3225 |
| 2023/0298381 A1 | 9/2023 | Xu et al. | |
| 2023/0298526 A1* | 9/2023 | Zhang | G09G 3/3233 345/76 |
| 2023/0410759 A1 | 12/2023 | Zong et al. | |
| 2024/0099058 A1* | 3/2024 | Choi | G09G 3/32 |
| 2024/0112630 A1* | 4/2024 | Bae | G09G 3/3233 |
| 2024/0155893 A1* | 5/2024 | Han | H10K 59/12 |
| 2024/0386845 A1* | 11/2024 | Yuan | G09G 3/3677 |

FOREIGN PATENT DOCUMENTS

| | | |
|---|---|---|
| CN | 103035195 A | 4/2013 |
| CN | 103943067 A | 7/2014 |
| CN | 105845081 A | 8/2016 |
| CN | 106157896 A | 11/2016 |
| CN | 106782339 A | 5/2017 |
| CN | 108986749 A | 12/2018 |
| CN | 109166896 A | 1/2019 |
| CN | 109817157 A | 5/2019 |
| CN | 110111738 A | 8/2019 |
| CN | 209729911 U | 12/2019 |
| CN | 111540771 A | 8/2020 |
| CN | 111599846 A | 8/2020 |
| CN | 112071882 A | 12/2020 |
| CN | 112542437 A | 3/2021 |
| CN | 112713157 A | 4/2021 |
| CN | 113540172 A | 10/2021 |
| CN | 113675252 A | 11/2021 |
| CN | 114120905 A | 3/2022 |
| CN | 114241996 A | 3/2022 |
| CN | 114497143 A | 5/2022 |
| CN | 114582288 A | 6/2022 |
| CN | 114725181 A | 7/2022 |
| CN | 114746932 A | 7/2022 |
| CN | 115023755 A | 9/2022 |
| CN | 115087956 A | 9/2022 |
| JP | 2009288748 A | 12/2009 |
| WO | 2019024395 A1 | 2/2019 |

OTHER PUBLICATIONS

US Office Action in U.S. Appl. No. 18/555,023 on Apr. 9, 2025.
European Search Report issued in European Application No. 22963155.1 dated Apr. 28, 2025.

* cited by examiner

PIXEL CIRCUIT AND DRIVING METHOD THEREOF, AND DISPLAY DEVICE

CROSS-REFERENCE TO RELATED APPLICATIONS

The present application claims the priority to PCT application No. PCT/CN2023/071892 filed on Jan. 12, 2023, the priority to PCT application No. PCT/CN2022/128241 filed on Oct. 28, 2022, the priority to PCT application No. PCT/CN2022/128244 filed on Oct. 28, 2022, and the priority to PCT application No. PCT/CN2022/128272 filed on Oct. 28, 2022, and the disclosures of the PCT applications are hereby incorporated by reference in their entirety as a part of the present application for all purposes.

TECHNICAL FIELD

Embodiments of the present disclosure relate to a pixel circuit and a driving method thereof, and a display device.

BACKGROUND

At present, display devices using organic light-emitting diode (OLED) technology have the advantage of fast response speed and maximized contrast ratio. Generally, in large and medium-sized OLED display devices, the pixel circuits all utilize N-metal-oxide-semiconductor (N-MOS) or all utilize P-metal-oxide-semiconductor (P-MOS). The light-emitting devices in the organic light-emitting diode display device emit light, and the light-emitting currents required by the light-emitting devices are provided by driving transistors. Therefore, for the uniformity of light-emitting of the display device, it is necessary to increase the consistency of device characteristics. For example, the compensation for transistor (TFT) devices can increase the consistency of device characteristics.

SUMMARY

Embodiments of the present disclosure provide a pixel circuit and a driving method thereof, and a display device.

Embodiments of the present disclosure provide a pixel circuit, the pixel circuit comprises: a driving circuit, a data writing circuit, a reset circuit, a light-emitting control circuit and a light-emitting element. The driving circuit comprises a control terminal, a first terminal and a second terminal, and the driving circuit is configured to control a driving current flowing through the first terminal and the second terminal for driving the light-emitting element to emit light; the light-emitting control circuit is connected to the first terminal of the driving circuit and a first voltage terminal, and is configured to apply a voltage of the first voltage terminal to the first terminal of the driving circuit in response to a light-emitting control signal; a first terminal of the light-emitting element is configured to receive the driving current, and a second terminal of the light-emitting element is connected to a second voltage terminal; an input terminal of the data writing circuit is connected to a data line, an output terminal of the data writing circuit is connected to a first node, and the data writing circuit is configured to apply a data voltage to the first node in response to a first control signal; a first output terminal of the reset circuit is connected to the first node, and the reset circuit is configured to apply a reference voltage to the first node in response to a second control signal; the pixel circuit further comprises a partition control circuit, the partition control circuit comprises a first terminal and a second terminal, the first terminal of the partition control circuit is connected to the first node, the second terminal of the partition control circuit is connected to the control terminal of the driving circuit, and the partition control circuit is configured to apply at least one of the data voltage and the reference voltage to the control terminal of the driving circuit in response to a partition control signal; and a second output terminal of the reset circuit is connected to one of the first terminal and the second terminal of the driving circuit, and the reset circuit is further configured to apply an initialization voltage to one terminal, connected to the second output terminal, of the first terminal and the second terminal of the driving circuit in response to the partition control signal and a third control signal.

For example, according to the embodiments of the present disclosure, the partition control circuit comprises a partition control transistor, the reset circuit comprises a first reset transistor, and a gate electrode of the partition control transistor and a gate electrode of the first reset transistor are electrically connected to a same partition control signal line to receive the partition control signal.

For example, according to the embodiments of the present disclosure, the reset circuit further comprises a second reset transistor, and a gate electrode of the second reset transistor is configured to receive the third control signal.

For example, according to the embodiments of the present disclosure, an input terminal of the first reset transistor is connected to a reset signal line, an output terminal of the first reset transistor is connected to a first terminal of the second reset transistor, and a second terminal of the second reset transistor is the second output terminal.

For example, according to the embodiments of the present disclosure, the second output terminal of the reset circuit is connected to the first terminal of the driving circuit.

For example, according to the embodiments of the present disclosure, the pixel circuit further comprises a storage circuit, a first terminal of the storage circuit is connected to a second node, a second terminal of the storage circuit is connected to a third node, the control terminal of the driving circuit is connected to the second node, and the second terminal of the driving circuit is connected to the third node.

For example, according to the embodiments of the present disclosure, the pixel circuit further comprises a storage circuit, a first terminal of the storage circuit is connected to a second node, a second terminal of the storage circuit is connected to a third node, the control terminal of the driving circuit is connected to the second node, and the second terminal of the driving circuit is connected to the third node; and the second output terminal of the reset circuit is connected to the third node.

For example, according to the embodiments of the present disclosure, the data writing circuit comprises a data writing transistor, a gate electrode of the data writing transistor is connected to a first control signal line to receive the first control signal, a first electrode of the data writing transistor is connected to the data line to receive a data signal, and a second electrode of the data writing transistor is connected to the first node.

For example, according to the embodiments of the present disclosure, the reset circuit comprises a third reset transistor, a gate electrode of the third reset transistor is connected to a second control signal line to receive the second control signal, a first electrode of the third reset transistor is connected to a reset signal line to receive a reference signal, and a second electrode of the third reset transistor is the first output terminal.

For example, according to the embodiments of the present disclosure, the gate electrode of the partition control transistor is connected to the partition control signal line to receive the partition control signal, a first electrode of the partition control transistor is connected to the first node, and a second electrode of the partition control transistor is connected to the control terminal of the driving circuit.

For example, according to the embodiments of the present disclosure, the light-emitting control circuit comprises a light-emitting control transistor, the driving circuit comprises a driving transistor, a gate electrode of the light-emitting control transistor is connected to a light-emitting control signal line to receive the light-emitting control signal, a first electrode of the light-emitting control transistor is connected to the first voltage terminal, a second electrode of the light-emitting control transistor is connected to a first electrode of the driving transistor, a gate electrode of the driving transistor is connected to the second node, and a second electrode of the driving transistor is connected to the third node.

For example, according to the embodiments of the present disclosure, the first terminal of the light-emitting element is connected to the second terminal of the driving circuit.

For example, according to the embodiments of the present disclosure, the storage circuit comprises a first capacitor, a first electrode plate of the first capacitor is connected to the second node, and a second electrode plate of the first capacitor is connected to the third node; and the pixel circuit comprises a second capacitor, a first electrode plate of the second capacitor is connected to the first terminal of the light-emitting element, a second electrode plate of the second capacitor is connected to the second terminal of the light-emitting element, and a capacitance value of the second capacitor is greater than a capacitance value of the first capacitor.

Embodiments of the present disclosure provide a display device, the display device comprises a display region and a peripheral region around the display region, the display device comprises a plurality of sub-pixels in the display region, and at least part of the sub-pixels respectively comprise any one of the above pixel circuits. The display device further comprises a plurality of partition control signal lines, the display region comprises a plurality of sub-regions, and partition control circuits of sub-pixels in at least two sub-regions are electrically connected to different partition control signal lines.

For example, according to the embodiments of the present disclosure, the display device further comprises: a circuit board in the peripheral region; a gate driving circuit structure in the peripheral region; a plurality of data lines arranged along a first direction; and a plurality of first control signal lines arranged along a second direction, the second direction intersecting with the first direction. The circuit board is configured to provide partition control signals for the partition control signal lines, the circuit board is further configured to provide data signals for the data lines, and the gate driving circuit structure is configured to provide first control signals for the first control signals.

For example, according to the embodiments of the present disclosure, the plurality of partition control signal lines comprise a plurality of first partition control signal lines and a plurality of second partition control signal lines, at least one of the plurality of first partition control signal lines extends along the first direction, at least one of the plurality of second partition control signal lines extends along the second direction, and one first partition control signal line is electrically connected to the circuit board through at least one second partition control signal line; and control terminals of partition control circuits of sub-pixels in a same sub-region are electrically connected to a same first partition control signal line, and are insulated from different first partition control signal lines electrically connected to sub-pixels in different sub-regions.

For example, according to the embodiments of the present disclosure, the second output terminal of the reset circuit is connected to the first terminal of the driving circuit.

For example, according to the embodiments of the present disclosure, the partition control circuit comprises a partition control transistor, the reset circuit comprises a first reset transistor, and in a same sub-pixel, a gate electrode of the partition control transistor and a gate electrode of the first reset transistor is electrically connected to a same partition control signal line to receive the partition control signal; and at least two sub-pixels share a same first reset transistor.

For example, according to the embodiments of the present disclosure, at least two sub-pixels share a same light-emitting control circuit.

Embodiments of the present disclosure provide a driving method for the above pixel circuit, the driving method comprises a reset phase, a compensation phase, a data writing phase and a light-emitting phase, in the reset phase, inputting the second control signal, the partition control signal and the third control signal to turn on the reset circuit and the partition control circuit, to reset the control terminal of the driving circuit and reset one terminal, connected to the second output terminal of the reset circuit, of the first terminal and the second terminal of the driving circuit; in the compensation phase, inputting the second control signal, the light-emitting control signal and the partition control signal to keep turning on the reset circuit, the partition control circuit and the driving circuit and turn on the light-emitting control circuit, to compensate the second terminal of the driving circuit through a voltage of the first voltage terminal; in the data writing phase, inputting the first control signal and the partition control signal, to keep turning on the partition control circuit and turn on the data writing circuit, to apply the data voltage to the control terminal of the driving circuit; and in the light-emitting phase, inputting the light-emitting control signal and the partition control signal, to keep turning on the partition control circuit and turn on the light-emitting control circuit and the driving circuit, to generate a driving current, and drive the light-emitting element to emit light.

For example, according to the embodiments of the present disclosure, the second output terminal of the reset circuit is connected to the first terminal of the driving circuit; and in the reset phase, turning on the driving circuit, and resetting both the first terminal and the second terminal of the driving circuit.

BRIEF DESCRIPTION OF DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. Features such as "parallel", "vertical/perpendicular" and "identical" used in the embodiments of the present disclosure include features such as "parallel", "vertical/perpendicular" and "identical" in the strict sense, as well as "approximately parallel", "approximately vertical/perpendicular" and "approximately identical" and other situations that contain certain errors. Considering the measurement and errors associated with a specific amount of measurement (that is, the limitation of the measurement system), the measurement is represented within an acceptable deviation range for specific values determined by those skilled in the art. For example, "approximately" can mean within one or more standard deviations, or within 10% or 5% of the value. In the case where the quantity of a component is not specifically indicated below in the embodiments of the present disclosure, it means that the component may be one or more, or may be understood as at least one. "At least one" means one or more, and "plurality" means at least two.

Figure 1:
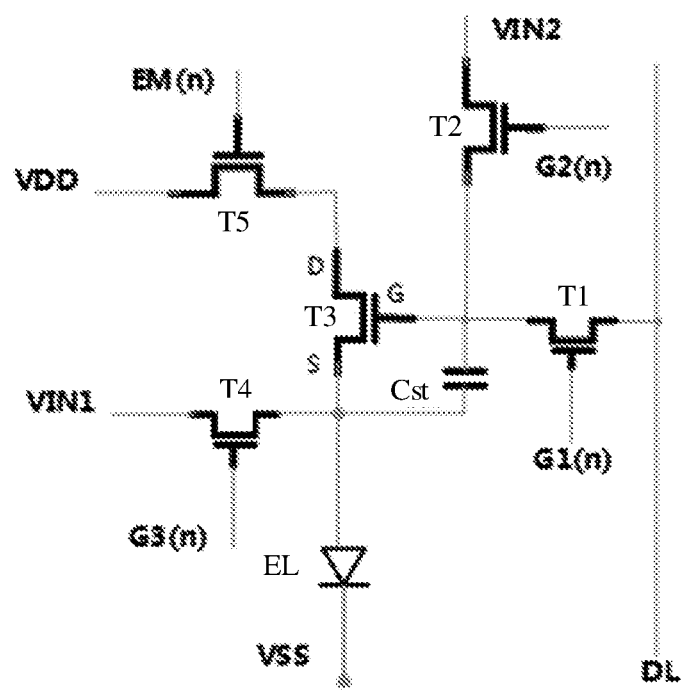
FIG. 1 is a schematic diagram of a pixel circuit.

FIG. 1 is a schematic diagram of a pixel circuit. As illustrated in FIG. 1, the pixel circuit includes a driving transistor T3, a light-emitting control transistor T5, a data writing transistor T1, a first reset transistor T2, a second reset transistor T4 and a storage capacitor Cst. For example, the pixel circuit illustrated in FIG. 1 may adopt a circuit structure with 5T1C (that is, five transistors and one capacitor).

For example, as illustrated in FIG. 1, a gate electrode of the driving transistor T3 is electrically connected to a second electrode of the data writing transistor T1 and a second electrode of the first reset transistor T2, a first electrode of the driving transistor T3 is electrically connected to a second electrode of the light-emitting control transistor T5, and a second electrode of the driving transistor T3 is electrically connected to a first terminal of the light-emitting element EL and a second electrode of the second reset transistor T4. For example, a first electrode of the data writing transistor T1 is configured to be electrically connected to a data line DL to receive a data signal, and a gate electrode of the data writing transistor T1 is electrically connected to a first gate line G1 and configured to write the data signal to the gate electrode of the driving transistor T3 in response to a first control signal. For example, a first electrode of the first reset transistor T2 is electrically connected to a reset signal line VIN2, and a gate electrode of the first reset transistor T2 is electrically connected to a second gate line G2 and configured to transmit a reference voltage to the gate electrode of the driving transistor T3 in response to a second control signal. For example, a first electrode of the second reset transistor T4 is electrically connected to a reset signal line VIN1, a gate electrode of the second reset transistor T4 is electrically connected to a third gate line G3 and configured to transmit an initialization voltage to the second electrode of the driving transistor T3 and the first terminal of the light-emitting element EL in response to a third control signal. For example, a first electrode of the light-emitting control transistor T5 is electrically connected to a first power supply VDD, and a gate electrode of the light-emitting control transistor T5 is electrically connected to a light-emitting control signal line EM and configured to transmit a first power supply voltage to the first electrode of the driving transistor T3 in response to a light-emitting control signal. For example, a first electrode plate of the storage capacitor Cst is electrically connected to the gate electrode of the driving transistor T3, a second electrode plate of the storage capacitor Cst is electrically connected to a second electrode of the driving transistor T3, and the storage capacitor Cst is configured to store the data signal. For example, a second terminal of the light-emitting element EL is electrically connected to a second power supply VSS.

For example, as illustrated in FIG. 1, a driving method of the pixel circuit includes a reset phase, a compensation phase, a data writing phase and a light-emitting phase.

For example, in the reset phase, signals of the second gate line G2 and the third gate line G3 are both at a high level, and signals of the first gate line G1 and the light-emitting control signal line EM are both at a low level; the second control signal and the third control signal are input, the first reset transistor T2 and the second reset transistor T4 are turned on, and the data writing transistor T1 and the light-emitting control transistor T5 are turned off; and the reference voltage is transmitted to the gate electrode of the driving transistor T3 through the first reset transistor T2 to reset the gate electrode of the driving transistor T3, and the initialization voltage is transmitted to the second electrode of the driving transistor T3 and the first terminal of the light-emitting element EL through the second reset transistor T4 to reset the second electrode of the driving transistor T3 and the first terminal of the light-emitting element EL.

For example, in the compensation phase, the signals of the second gate line G2 and the light-emitting control signal line EM are both at a high level, and the signals of the first gate line G1 and the third gate line G3 are both at a low level; the second control signal and the light-emitting control signal line are input, the first reset transistor T2 is kept to be turned on, the data write transistor T1 and the second reset transistor T4 are turned off, and the light-emitting control transistor T5 and the driving transistor T3 are turned on; and the second electrode of the driving transistor T3 is charged through the first power supply VDD to compensate the driving transistor T3.

For example, in the data writing phase, the signal of the first gate line G1 is at a high level, and the signals of the second gate line G2, the third gate line G3 and the light-emitting control signal line EM are all at a low level; the data writing transistor T1 is turned on, and other transistors are turned off; and the voltage of the gate electrode of the driving transistor T3 jumps from the reference voltage to the data voltage, the voltages of the two electrode plates of the storage capacitor Cst jumps correspondingly, and the storage capacitor Cst is charged.

For example, in the light-emitting phase, the voltage of the light-emitting control signal line EM is at a high level, the voltages of the first gate line G1, the second gate line G2 and the third gate line G3 are all at a low level, and the light-emitting control transistor T5 and the driving transistor T3 are turned on to generate a driving current to drive the light-emitting element EL to emit light. The data writing transistor T1, the first reset transistor T2 and the second reset transistor T4 are turned off.

At present, the compensation methods for transistors are divided into internal compensation and external compensation. Because the internal compensation is self-adaptive and the external driving integrated circuit (IC) is simple, currently, small-sized display devices widely use pixels with the pixel circuit illustrated in FIG. 1.

During research, the inventor(s) of the present application found that, when a large-sized display device displays, the pixel circuit illustrated in FIG. 1 cannot be used to achieve partitioned display.

The present disclosure provides a pixel circuit and a driving method thereof, and a display device. The pixel circuit includes a driving circuit, a data writing circuit, a reset circuit, a light-emitting control circuit and a light-emitting element. The driving circuit includes a control terminal, a first terminal and a second terminal, and the driving circuit is configured to control a driving current flowing through the first terminal and the second terminal for driving the light-emitting element to emit light; the light-emitting control circuit is connected to the first terminal of the driving circuit and a first voltage terminal, and is configured to apply a voltage of the first voltage terminal to the first terminal of the driving circuit in response to a light-emitting control signal; a first terminal of the light-emitting element is configured to receive the driving current, and a second terminal of the light-emitting element is connected to a second voltage terminal; an input terminal of the data writing circuit is connected to a data line, an output terminal of the data writing circuit is connected to a first node, and the data writing circuit is configured to apply a data voltage to the first node in response to a first control signal; and a first output terminal of the reset circuit is connected to the first node, and the reset circuit is configured to apply a reference voltage to the first node in response to a second control signal. The pixel circuit further includes a partition control circuit, the partition control circuit includes a first terminal and a second terminal, the first terminal of the partition control circuit is connected to the first node, the second terminal of the partition control circuit is connected to the control terminal of the driving circuit, and the partition control circuit is configured to apply at least one of the data voltage and the reference voltage to the control terminal of the driving circuit in response to a partition control signal; and a second output terminal of the reset circuit is connected to one of the first terminal and the second terminal of the driving circuit, and the reset circuit is further configured to apply an initialization voltage to one terminal, connected to the second output terminal, of the first terminal and the second terminal of the driving circuit in response to the partition control signal and a third control signal. In the pixel circuit provided by the present disclosure, the partition control circuit is provided to apply at least one of the data voltage and the reference voltage to the control terminal of the driving circuit in response to the partition control signal, and the reset circuit is configured to apply the initialization voltage to one terminal, connected to the second output terminal, of the first terminal and the second terminal of the driving circuit in response to the partition control signal and the third control signal, so that the pixel circuit can achieve partitioned display when applied to a display device.

The pixel circuit and the driving method thereof, and the display device provided by the embodiments of the present disclosure will be described below with reference to the drawings.

Figure 2:
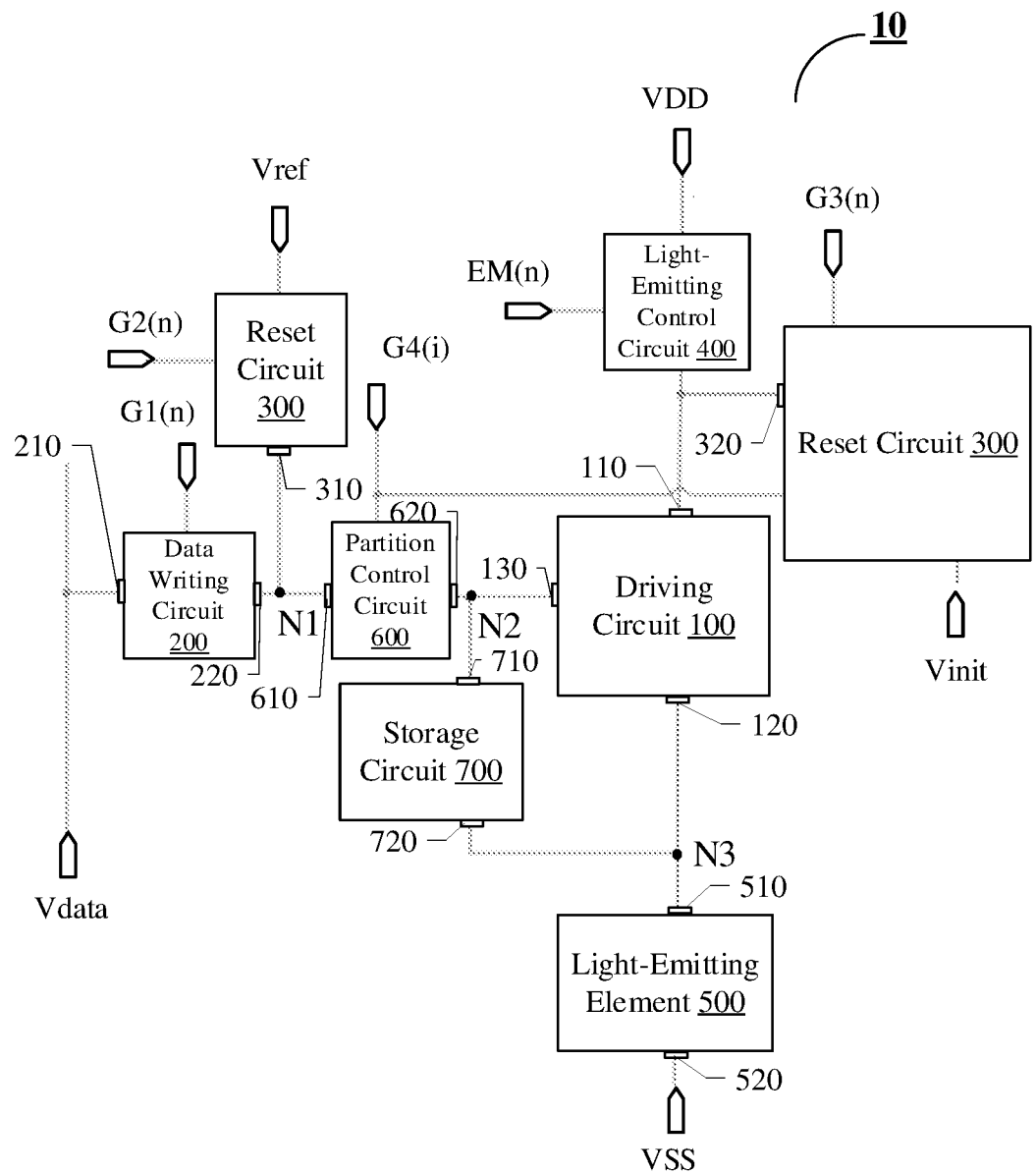
FIG. 2 is a schematic block diagram of a pixel circuit provided by an example of the embodiments of the present disclosure.

FIG. 2 is a schematic block diagram of a pixel circuit provided by an example of the embodiments of the present disclosure. As illustrated in FIG. 2, the pixel circuit 10 includes a driving circuit 100, a data writing circuit 200, a reset circuit 300, a light-emitting control circuit 400 and a light-emitting element 500.

As illustrated in FIG. 2, the driving circuit 100 includes a control terminal 130, a first terminal 110 and a second terminal 120, and the driving circuit 100 is configured to control a driving current flowing through the first terminal 110 and the second terminal 120 for driving the light-emitting element 500 to emit light. For example, the control terminal 130 of the driving circuit 100 is connected to a second node N2, and the second terminal 120 of the driving circuit 100 is connected to a third node N3. For example, in a light-emitting phase, the driving circuit 100 can provide a driving current to the light-emitting element 500 to drive the light-emitting element 500 to emit light, and can emit light according to the required "gray scale".

As illustrated in FIG. 2, an input terminal 210 of the data writing circuit 200 is connected to a data line (a data signal terminal Vdata), an output terminal 220 of the data writing circuit 200 is connected to a first node N1, and the data writing circuit 200 is configured to apply the data voltage to the first node N1 in response to a first control signal. For example, the data writing circuit 200 is connected to the data line (the data signal terminal Vdata), the first node N1 and a first control signal line (a first control signal terminal G1(n)). For example, the first control signal from the first control signal terminal G1(n) is applied to the data writing circuit 200 to control whether the data writing circuit 200 is turned on or not.

As illustrated in FIG. 2, the light-emitting control circuit 400 is connected to the first terminal 110 of the driving circuit 100 and a first voltage terminal VDD, and is configured to apply the voltage of the first voltage terminal VDD to the first terminal 110 of the driving circuit 100 in response to the light-emitting control signal. For example, the light-emitting control circuit 400 is connected to a light-emitting control terminal EM, the first voltage terminal VDD and the first terminal 110 of the driving circuit 100. For example, the light-emitting control terminal EM may be connected to a light-emitting control line that provides the light-emitting control signal, or connected to a control circuit that provides the light-emitting control signal.

For example, in a light-emitting phase, the light-emitting control circuit 400 may be turned on in response to the light-emitting control signal, so that the first voltage VDD is applied to the first terminal 110 of the driving circuit 100, and when the driving circuit 100 is turned on, the driving circuit 100 can apply the first voltage VDD to the light-emitting element 500 to provide a driving voltage to drive the light-emitting element to emit light. For example, the first voltage VDD may be a driving voltage, such as a high voltage (higher than a second voltage VSS). For example, in a non-light-emitting phase, the light-emitting control circuit 400 is turned off in response to the light-emitting control signal to prevent current from flowing through the light-emitting element 500 to make it emit light.

As illustrated in FIG. 2, a first terminal 510 of the light-emitting element 500 is configured to receive a driving current, and a second terminal 520 of the light-emitting element 500 is connected to a second voltage terminal VSS. For example, the first terminal 510 of the light-emitting element 500 is connected to the third node N3, and the light-emitting element 500 may adopt an OLED, and configured to be connected to the third node N3 and the second voltage terminal VSS (for example, providing a low level, such as grounding), the embodiments of the present disclosure include but are not limited thereto.

As illustrated in FIG. 2, a first output terminal 310 of the reset circuit 300 is connected to the first node N1, and the reset circuit 300 is configured to apply a reference voltage to the first node N1 in response to a second control signal. For example, the reset circuit 300 is connected to a second control signal line (a second control signal terminal G2 (n)), a reset signal line (a reference voltage terminal Vref) and the first node N1. For example, the second control signal from the second control signal terminal G2 (n) is applied to the reset circuit 300 to control whether the reset circuit 300 is turned on or not. For example, the reset circuit 300 is connected to the first node N1 to reset the voltage at the position of the first node N1.

As illustrated in FIG. 2, the pixel circuit 10 further includes a partition control circuit 600, the partition control circuit 600 includes a first terminal 610 and a second terminal 620, the first terminal 610 of the partition control circuit 600 is connected to the first node N1, the second terminal 620 of the partition control circuit 600 is connected to the control terminal 130 of the driving circuit 100, and the partition control circuit 600 is configured to apply at least one of the data voltage and the reference voltage to the control terminal 130 of the driving circuit 100 in response to a partition control signal. For example, the partition control circuit 600 is connected to a partition control signal line (a partition control signal terminal G4 (i)), the first node N1 and the second node N2. For example, the partition control signal from the partition control signal terminal G4 (i) is applied to the partition control circuit 600 to control whether the partition control circuit 600 is turned on or not.

For example, in a data writing phase, the data writing circuit 200 may be turned on in response to the first control signal, so that the data signal is written into the first node N1, the partition control circuit 600 is turned on in response to the partition control signal, the data signal is written into the control terminal 130 of the driving circuit 100 through the partition control circuit 600 that is turned on, and the data signal is stored in a storage circuit 700 (described later), so that, for example, in the light-emitting phase, the driving current for driving the light-emitting element 500 to emit light can be generated according to the data signal.

For example, in a reset phase, the reset circuit 300 may be turned on in response to a second control signal, so that the reference voltage can be written into the first node N1, the partition control circuit 600 may be turned on in response to the partition control signal, and the reference voltage is written into the control terminal 130 of the driving circuit 100 through the partition control circuit 600 that is turned on, to reset the control terminal 130 of the driving circuit 100.

As illustrated in FIG. 2, a second output terminal 320 of the reset circuit 300 is connected to one of the first terminal 110 and the second terminal 120 of the driving circuit 100, and the reset circuit 300 is further configured to apply an initialization voltage to one terminal, connected to the second output terminal 320, of the first terminal 110 and the second terminal 120 of the driving circuit 100 in response to the partition control signal G4 (i) and a third control signal G3 (n). For example, the reset circuit 300 is connected to the partition control signal line (the partition control signal terminal G4 (i)), a third control signal line (a third control signal terminal G3 (n)), a reset signal line (an initialization voltage terminal Vinit) and the driving circuit 100. For example, the third control signal from the third control signal terminal G3 (n) and the partition control signal from the partition control signal terminal G4 (i) are applied to the reset circuit 300 to control whether the reset circuit 300 is turned on or not. For example, the second output terminal 320 of the reset circuit 300 is connected to one of the first terminal 110 and the second terminal 120 of the driving circuit 100 to reset the first terminal 110 and the second terminal 120 of the driving circuit 100.

For example, in the reset phase, the reset circuit 300 may also be turned on in response to the partition control signal and the third control signal, so that the initialization voltage can be written into the first terminal 110 of the driving circuit 100 to reset the first terminal 110 of the driving circuit 100. For example, the reset circuit 300 is turned on in response to the partition control signal and the third control signal, and after the first terminal 110 of the driving circuit 100 is reset, the initialization signal passes through the driving circuit 100 that is turned on, and then reset the second terminal 120 of the driving circuit 100. For example, the initialization signal resets the first terminal 510 of the light-emitting element 500 through the reset circuit 300 and the driving circuit 100 that are turned on, thereby eliminating the influence of the previous light-emitting phase.

The pixel circuit provided by the embodiments of the present disclosure, by providing the partition control circuit and causing the partition control circuit and the reset circuit to be turned on in response to the partition control signal, can achieve resetting of the control terminal, the first terminal, and the second terminal of the driving circuit and achieve writing of the data signal to the control terminal of the driving circuit, and therefore the pixel circuit, when applied to a display device, can achieve partitioned display, such as updating a partitioned image alone without updating the display images of other regions, which facilitates the dynamic picture response time (MPRT) of a local region and reduces the overall power consumption of the display device, and further achieves an ultra-high refresh frequency of certain partitions.

It should be noted that the reset circuit connected to a second signal control terminal G2 (n) and the reset circuit connected to a third signal terminal G3 (n) illustrated in FIG. 2 may be two independent circuits, such as a first reset circuit and a second reset circuit, respectively, and there is no direct electrical connection relationship between the first reset circuit and the second reset circuit.

It should be noted that, in the embodiments of the present disclosure, the first voltage terminal VDD, for example, maintains the input of a direct current high level signal, and the direct current high level is referred to as a first voltage; the second voltage terminal VSS, for example, maintains the input of a direct current low level signal, and the direct current low level is referred to as a second voltage, which is lower than the first voltage. The following embodiments are identical thereto and will not be repeated herein.

It should be noted that, in the description of the embodiments of the present disclosure, the first node N1, the second node N2, and the third node N3 do not represent actual components, but represent junction points of related circuit connections in the circuit diagram.

It should be noted that, in the description of the embodiments of the present disclosure, the symbol Vdata can represent both the data signal terminal and the level of the data signal. Similarly, the symbol Vinit can represent both the initialization voltage terminal and the initialization voltage, the symbol VDD can represent both the first voltage terminal and the first voltage, and the symbol VSS can represent both the second voltage terminal and the second voltage. The following embodiments are identical thereto and will not be repeated herein.

For example, as illustrated in FIG. 2, the reset circuit 300, the data writing circuit 200, and the light-emitting control circuit 400 are all turned on or off in response to a control signal of the present row of pixel circuits, for example, the present row may be an n-th row, and n may be a positive integer greater than or equal to 1. For example, the pixel circuit illustrated in FIG. 2 may be a pixel circuit in an i-th sub-region of a plurality of sub-regions of the display device, where i is a positive integer greater than or equal to 1.

Figure 3:
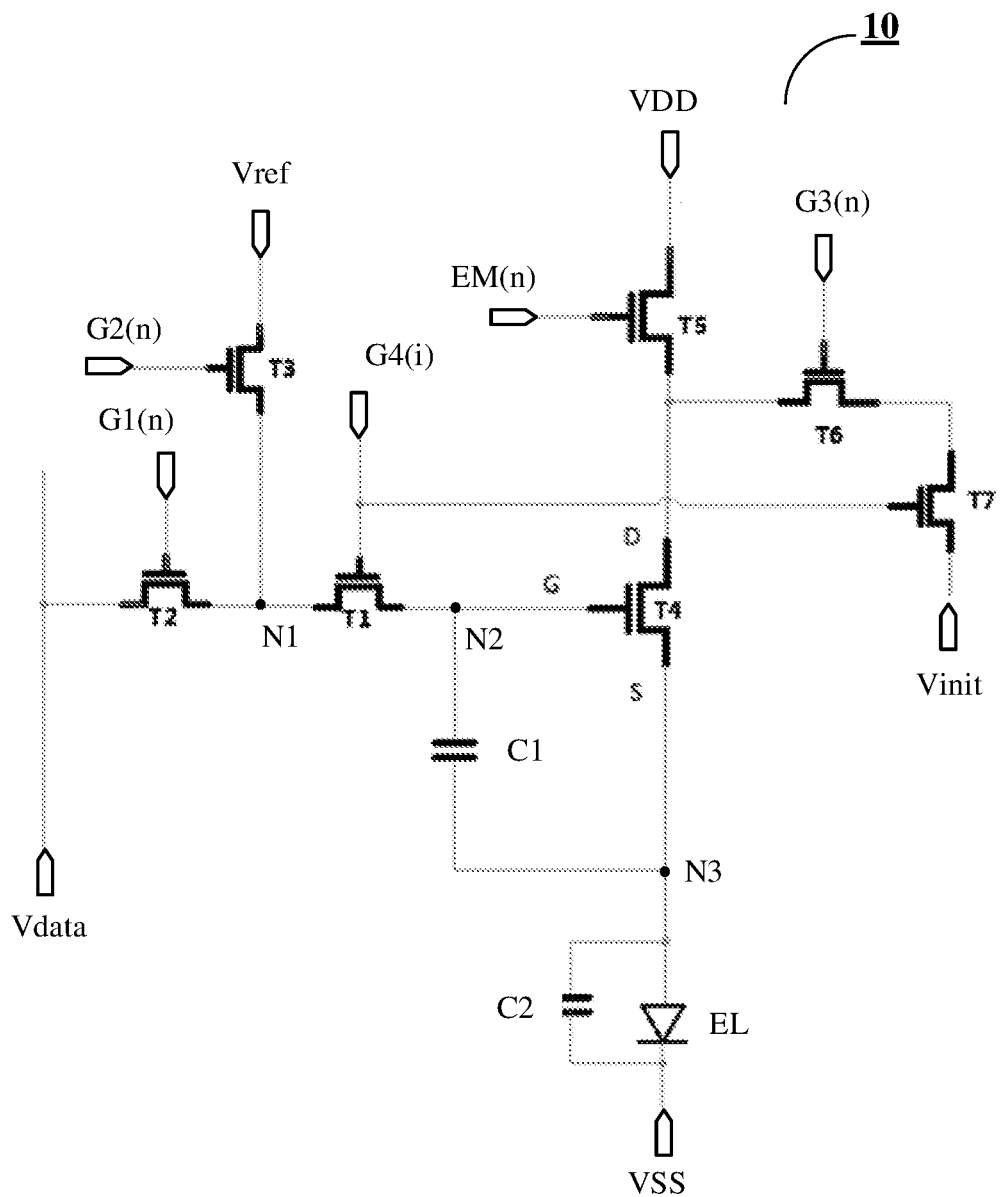
FIG. 3 is a circuit diagram of a specific implementation example of the pixel circuit illustrated in FIG. 2.

FIG. 3 is a circuit diagram of a specific implementation example of the pixel circuit illustrated in FIG. 2.

For example, the pixel circuit 10 illustrated in FIG. 2 may be implemented as the pixel circuit structure illustrated in FIG. 3. As illustrated in FIG. 3, the pixel circuit 10 includes seven transistors T1, T2, T3, T4, T5, T6, T7, a capacitor C and a light-emitting element EL. For example, the pixel circuit 10 includes two capacitors, for example, the pixel circuit 10 has a 7T2C circuit structure. For example, the transistor T3 is served as a driving transistor, and the other transistors are served as switching transistors. For example, the light-emitting element EL may be various types of OLEDs, such as top emission, bottom emission, double-side emission, etc., and may emit red light, green light, blue light, or white light, which is not limited by the embodiments of the present disclosure.

It should be noted that all the transistors adopted in the embodiment of the present disclosure may be thin film transistors, field effect transistors or other switching elements with the same characteristics. A source electrode and a drain electrode of the transistor adopted herein are symmetrical in structure, so the source electrode and the drain electrode of the transistor may have no difference in structure. In the embodiment of the present disclosure, in order to distinguish two electrodes of the transistor except the gate electrode, one electrode is directly described as the first electrode and the other electrode is directly described as the second electrode, so the first electrode and the second electrode of all or part of the transistors in the embodiments of the present disclosure can be interchanged as required. For example, the first electrode of the transistor in the embodiments of the present disclosure is the source electrode, and the second electrode is the drain electrode; or the first electrode of the transistor is the drain electrode and the second electrode is the source electrode.

In addition, the transistors can be divided into N-type transistors and P-type transistors according to characteristics of the transistors. The embodiments of the present disclosure are illustrated by an example in which the transistors are all N-type transistors (N-MOS). Based on the description and teaching of this implementation in the present disclosure, those skilled in the art can easily think of adopting P-type transistors for at least some of the transistors in the pixel circuit structure of the embodiments of the present disclosure without creative work, that is, adopting P-type transistors or a combination of N-type transistors and P-type transistors, therefore, these implementations are also within the protection scope of the present disclosure.

In some examples, as illustrated in FIG. 2 and FIG. 3, the partition control circuit 600 includes a partition control transistor T1, the reset circuit 300 includes a first reset transistor T1, and a gate electrode of the partition control transistor T1 and a gate electrode of the first reset transistor T7 are electrically connected to the same one partition control signal line to receive the partition control signal. For example, the partition control transistor T1 and the first reset transistor T7 are turned on or turned off simultaneously to refresh or retain data for the pixel circuit.

The pixel circuit provided by the present disclosure, by providing the partition control transistor and the first reset transistor that can respond to the partition control signal, can perform resetting of the control terminal, the first terminal and the second terminal of the driving circuit, and the first terminal of the light-emitting element, and writing of the data signal under the control of the partition control signal, and therefore when the pixel circuit is applied to a display device, in a partition that needs to be refreshed separately, the partition control transistor and the first reset transistor of the pixel circuit in this partition are turned on in response to the partition control signal, the driving transistor of the pixel circuit and the first terminal of the light-emitting element are reset, and the pixel circuit is input with the refreshed data signal to achieve the update of the display image in this partition; and in a partition that does not need to be refreshed separately, the partition control transistor and the first reset transistor of the pixel circuit in this partition are turned off in response to the partition control signal, and the display data of the pixel circuit is not changed to maintain the original display image.

In some examples, as illustrated in FIG. 2 and FIG. 3, the gate electrode of the partition control transistor T1 is connected to the partition control signal line to receive the partition control signal, the first electrode of the partition control transistor T1 is connected to the first node N1, and the second electrode of the partition control transistor T1 is connected to the control terminal 310 of the driving circuit 300, for example, the second electrode of the partition control transistor T1 is connected to the second node N2. For example, the partition control transistor T1 is turned on in response to the partition control signal, and the signal of the first node N1 is transmitted to the second node N2 through the partition control transistor T1 that is turned on to achieve an individual refresh signal of the pixel circuit.

In some examples, as illustrated in FIG. 2 and FIG. 3, the reset circuit 300 further includes a second reset transistor T6, and a gate electrode of the second reset transistor T6 is configured to receive a third control signal.

In some examples, as illustrated in FIG. 2 and FIG. 3, an input terminal of the first reset transistor T7 is connected to the reset signal line (initialization voltage terminal Vinit), an output terminal of the first reset transistor T7 is connected to a first terminal of the second reset transistor T6, and a second terminal of the second reset transistor T6 is the second output terminal 320 of the reset circuit 300. For example, a first electrode of the first reset transistor T7 is connected to the initialization voltage terminal Vinit, a second electrode of the first reset transistor T7 is connected to a first electrode of the second reset transistor T6, and a gate electrode of the second reset transistor T6 is connected to a third control signal line.

For example, as illustrated in FIG. 2 and FIG. 3, the reset circuit 300 includes a second reset circuit, the second reset circuit includes a first reset transistor T7 and a second reset transistor T6, and when the first reset transistor T7 is turned on in response to the partition control signal, and the second reset transistor T6 is turned on in response to the third control signal, the reset signal is written into a terminal, connected to the second output terminal 320, of the driving circuit 100 through the second reset circuit that is turned on to reset the terminal.

For example, FIG. 3 schematically illustrates that the second electrode of the second reset transistor T6 is the second output terminal 320 of the reset circuit 300, but the embodiments of the present disclosure are not limited thereto. The positions of the first reset transistor T7 and the second reset transistor T6 can be interchanged, for example, the gate electrode of the second reset transistor T6 is connected to the third control signal line, the first electrode of the second reset transistor T6 is connected to the initialization voltage terminal Vinit, the second electrode of the second reset transistor T6 is connected to the first electrode of the first reset transistor T7, the second electrode of the first reset transistor T7 is the second output terminal of the reset circuit 300, and the gate electrode of the first reset transistor T7 is connected to the partition control signal line.

In some examples, as illustrated in FIG. 2 and FIG. 3, the second output terminal 320 of the reset circuit 300 is connected to the first terminal 110 of the driving circuit 100.

In some examples, as illustrated in FIG. 2 and FIG. 3, the reset circuit 300 includes a third reset transistor T3, a gate electrode of the third reset transistor T3 is connected to a second control signal line (a second signal control terminal G2 (n)) to receive a second control signal, a first electrode of the third reset transistor T3 is connected to a reset signal line (a reference voltage terminal Vref) to receive a reference signal, and a second electrode of the third reset transistor T3 is the first output terminal 310 of the reset circuit 300. For example, the reset circuit 300 includes a first reset circuit, the first reset circuit includes a third reset transistor T3, and a second electrode of the third reset transistor T3 is connected to the first electrode of the partition control transistor T1.

In some examples, as illustrated in FIG. 2 and FIG. 3, the data writing circuit 200 includes a data writing transistor T2, a gate electrode of the data writing transistor T2 is connected to a first control signal line (a first signal control terminal G1(n)) to receive the first control signal, a first electrode of the data writing transistor T2 is connected to a data line (a data signal terminal Vdata) to receive the data signal, and a second electrode of the data writing transistor T2 is connected to the first node N1. For example, the second electrode of the data writing transistor T2 is connected to the second electrode of the third reset transistor T3 and the first electrode of the partition control transistor T1.

In some examples, as illustrated in FIG. 2 and FIG. 3, the light-emitting control circuit 400 includes a light-emitting control transistor T5, and the driving circuit 100 includes a driving transistor T4. A gate electrode of the light-emitting control transistor T5 is connected to a light-emitting control signal line (a light-emitting control terminal EM) to receive the light-emitting control signal, a first electrode of the light-emitting control transistor T5 is connected to the first voltage terminal VDD, a second electrode of the light-emitting control transistor T5 is connected to a first electrode of the driving transistor T4, a gate electrode of the driving transistor T4 is connected to the second node N2, and a second electrode of the driving transistor T4 is connected to the third node N3. For example, the second electrode of the partition control transistor T1 is connected to the gate electrode of the driving transistor T4, and the second electrode of the light-emitting control transistor T5 is connected to the second electrode of the second reset transistor T6 and the first electrode of the driving transistor T4.

In some examples, as illustrated in FIG. 2 and FIG. 3, a first terminal 510 of the light-emitting element EL is connected to the second terminal 120 of the driving circuit 100. For example, the light-emitting element EL includes a first electrode, a second electrode, and a light-emitting layer between the first electrode and the second electrode. For example, the first terminal 510 of the light-emitting element EL includes the first electrode, and a second terminal of the light-emitting element EL includes the second electrode. For example, the first electrode of the light-emitting element EL is connected to the second electrode of the driving transistor T4, and the second electrode of the light-emitting element EL is connected to the second voltage terminal VSS.

In some examples, as illustrated in FIG. 2 and FIG. 3, the pixel circuit 10 further includes a storage circuit 700, a first terminal 710 of the storage circuit 700 is connected to the second node N2, a second terminal 720 of the storage circuit 700 is connected to the third node N3, the control terminal 130 of the driving circuit 100 is connected to the second node N2, and the second terminal 120 of the driving circuit 100 is connected to the third node N3.

In some examples, as illustrated in FIG. 2 and FIG. 3, the storage circuit 700 includes a first capacitor C1, a first electrode plate of the first capacitor C1 is connected to the gate electrode of the driving transistor T4 and the second electrode of the partition control transistor T1, and a second electrode plate of the first capacitor C1 is connected to the second electrode of the driving transistor T4 and the first electrode of the light-emitting element EL. For example, the first capacitor C1 is configured to store the data signal.

In some examples, as illustrated in FIG. 2 and FIG. 3, the pixel circuit includes a second capacitor C2, a first electrode plate of the second capacitor C2 is connected to the first terminal of the light-emitting element EL, a second electrode plate of the second capacitor C2 is connected to the second terminal of the light-emitting element EL, and the capacitance value of the second capacitor C2 is greater than the capacitance value of the first capacitor C1. For example, the second capacitor C2 may be a portion of the light-emitting element. For example, the first electrode plate of the second capacitor C2 may be the first electrode of the light-emitting element EL, and the second electrode plate of the second capacitor C2 may be the second electrode of the light-emitting element EL, and the second capacitor may be the intrinsic capacitance of the light-emitting element EL, but the embodiments are not limited thereto, the second capacitor may also be a separate capacitor provided at both ends of the light-emitting element.

For example, as illustrated in FIG. 3, the second electrode of the driving transistor T4, the second electrode plate of the first capacitor C1, the first electrode of the light-emitting element EL, and the first electrode plate of the second capacitor C2 are all connected to each other, that is, connected to the third node N3. There are many components connected to the third node N3, which is prone to leakage current and makes the voltage of the third node N3 unstable. Providing the second capacitor C2 can stabilize the voltage of the third node N3 and make the driving current more accurate.

The pixel circuit provided by the present embodiment adopts internal compensation, and by setting the second capacitance value, the pixel circuit can prevent the third node from being fully coupled when writing data in the data writing phase, resulting in data writing failure.

Figure 4:
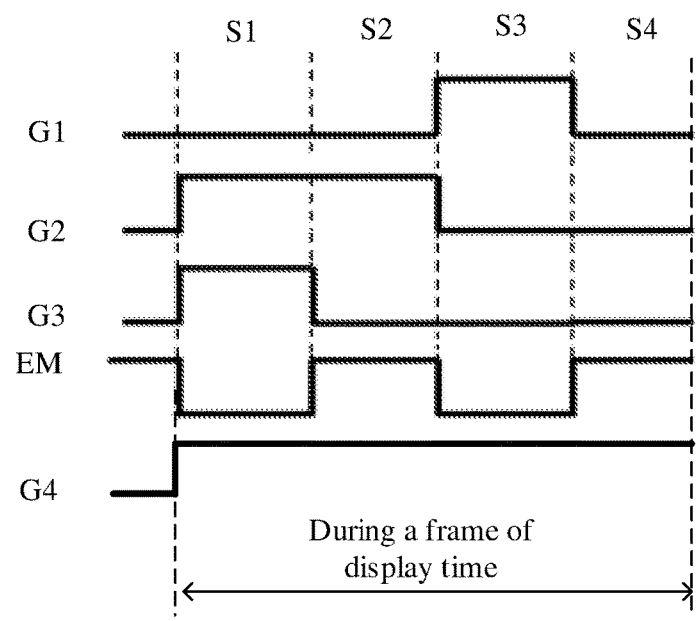
FIG. 4 is a timing diagram of a driving method of a pixel circuit provided by an embodiment of the present disclosure.
Figure 5:
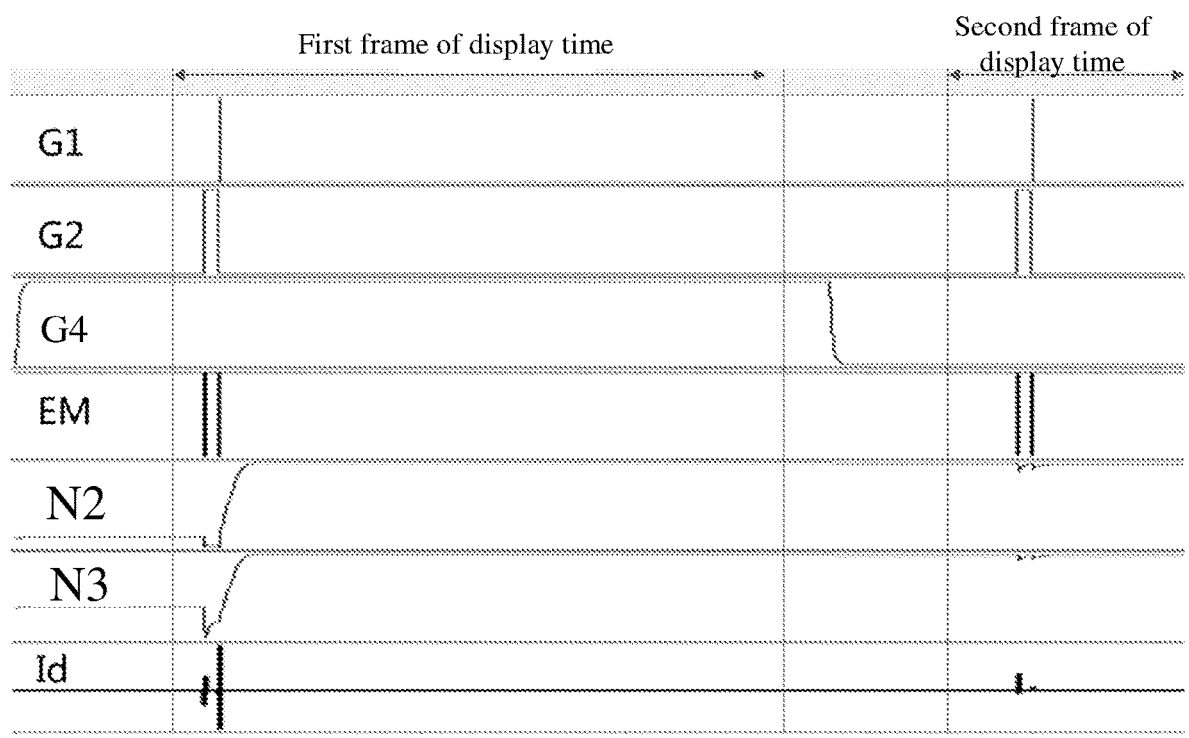
FIG. 5 is a simulation diagram of two frames of a pixel circuit provided by the embodiments of the present disclosure.
Figure 6:
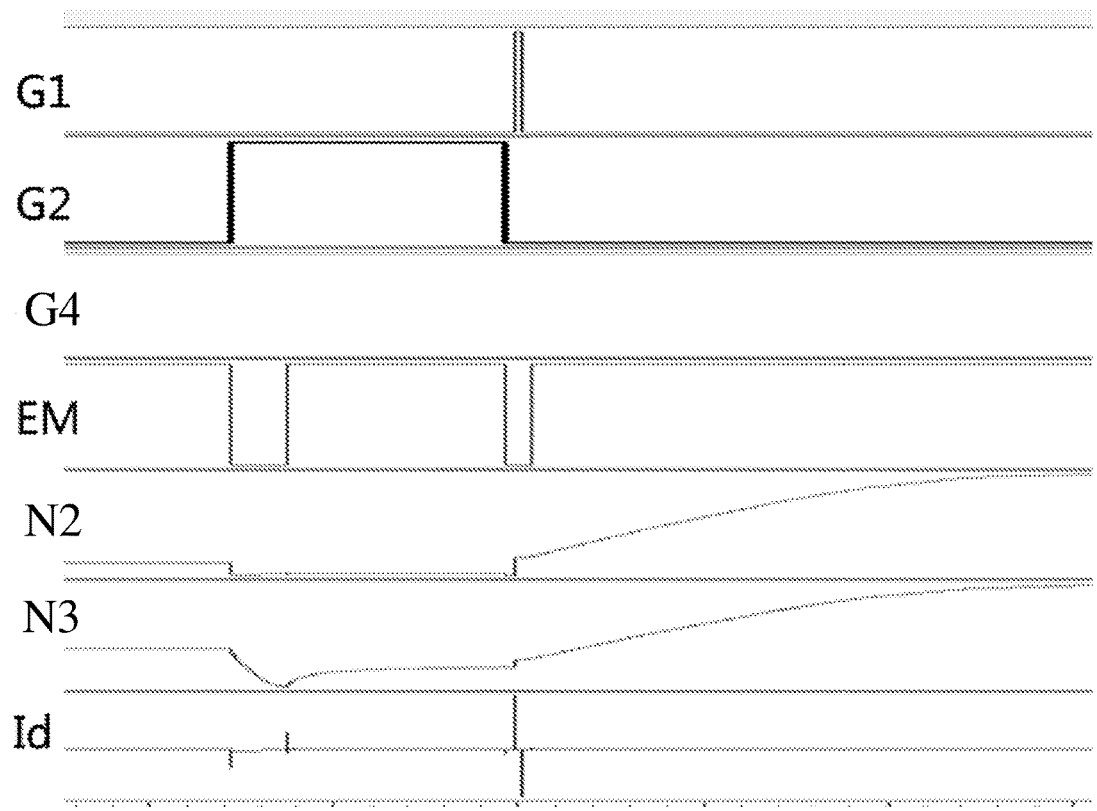
FIG. 6 and FIG. 7 are respectively enlarged views of a simulation diagram of a first frame and a simulation diagram of a second frame illustrated in FIG. 5.
Figure 7:
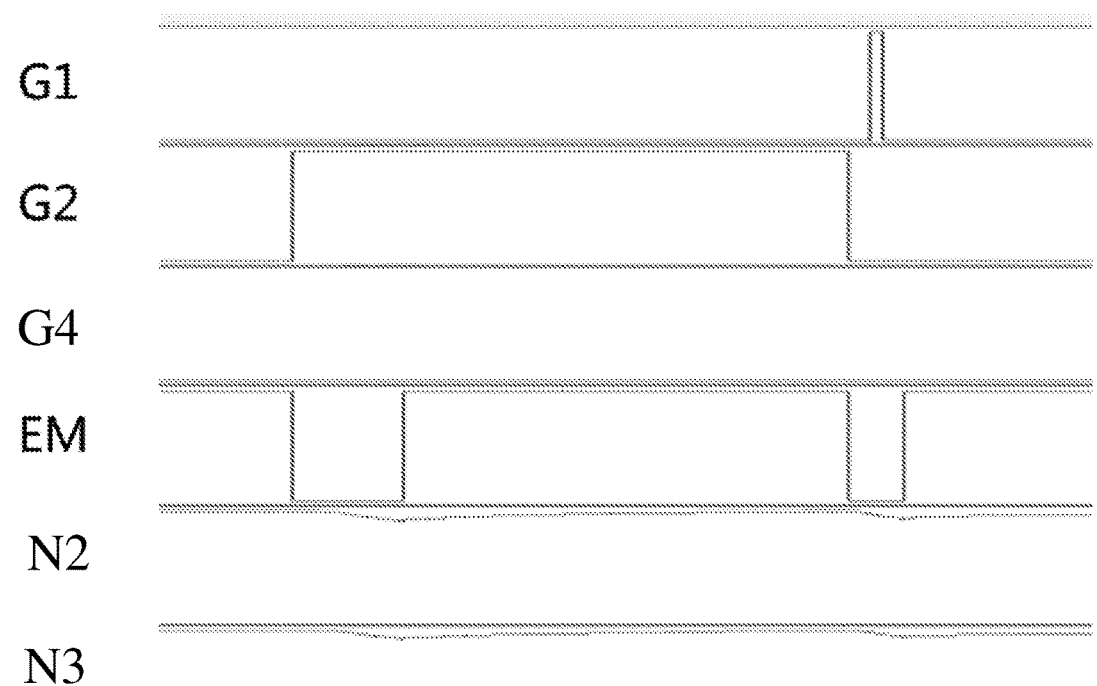
Figure 8:
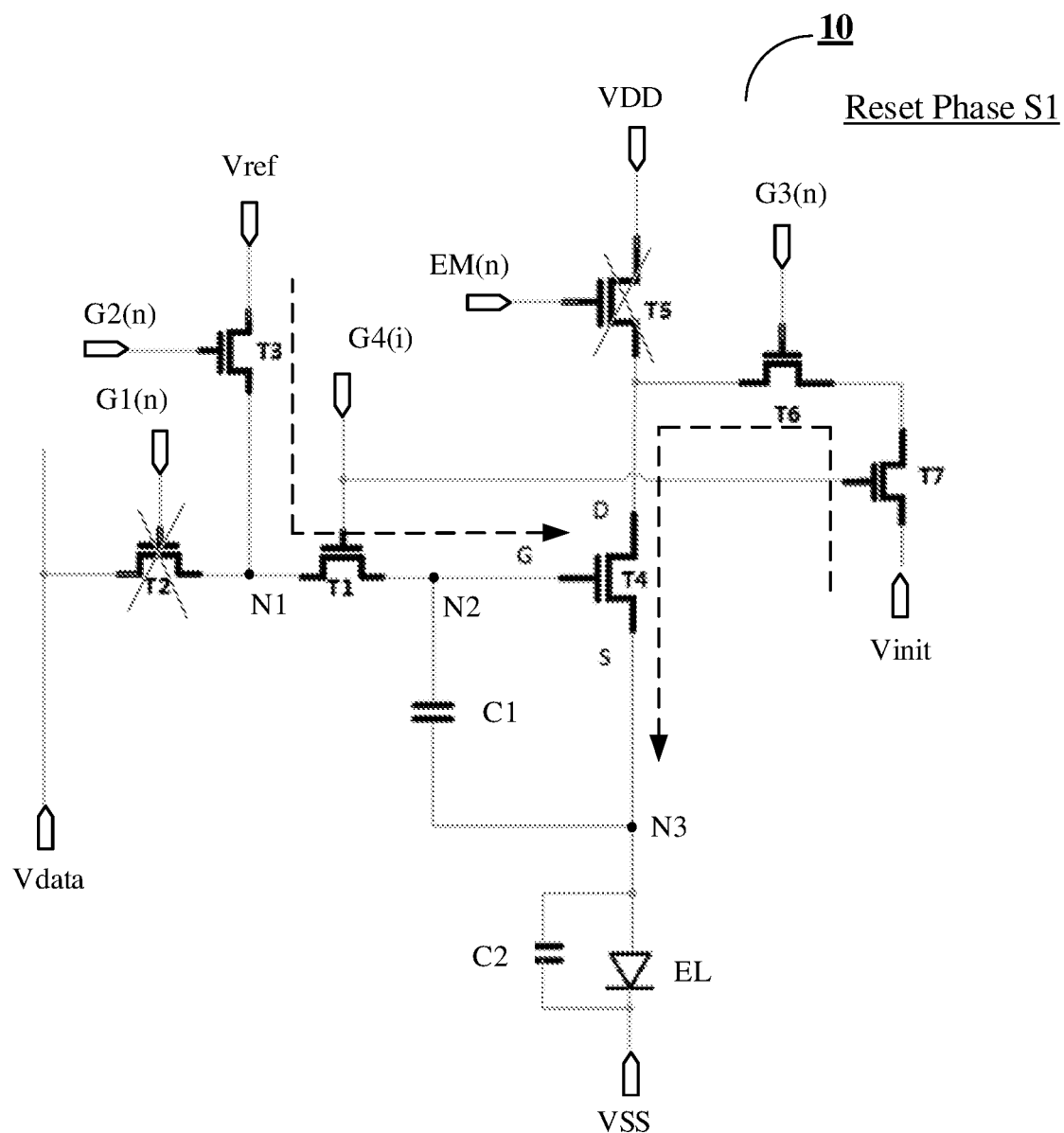
FIG. 8 is a schematic diagram of transistor switch states in a reset phase of a pixel circuit provided by the embodiments of the present disclosure.
Figure 9:
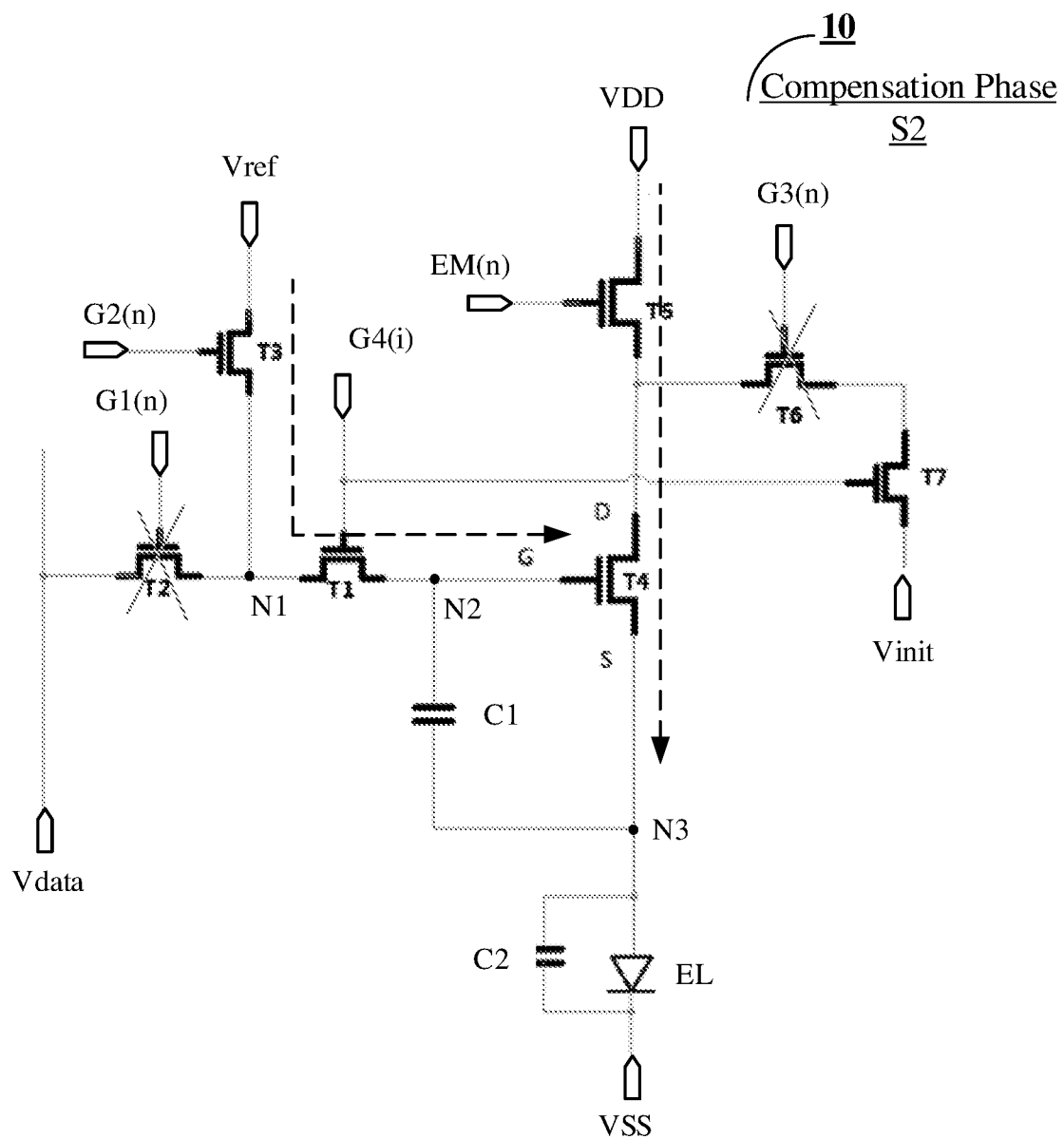
FIG. 9 is a schematic diagram of transistor switch states in a compensation phase of a pixel circuit provided by the embodiments of the present disclosure.
Figure 10:
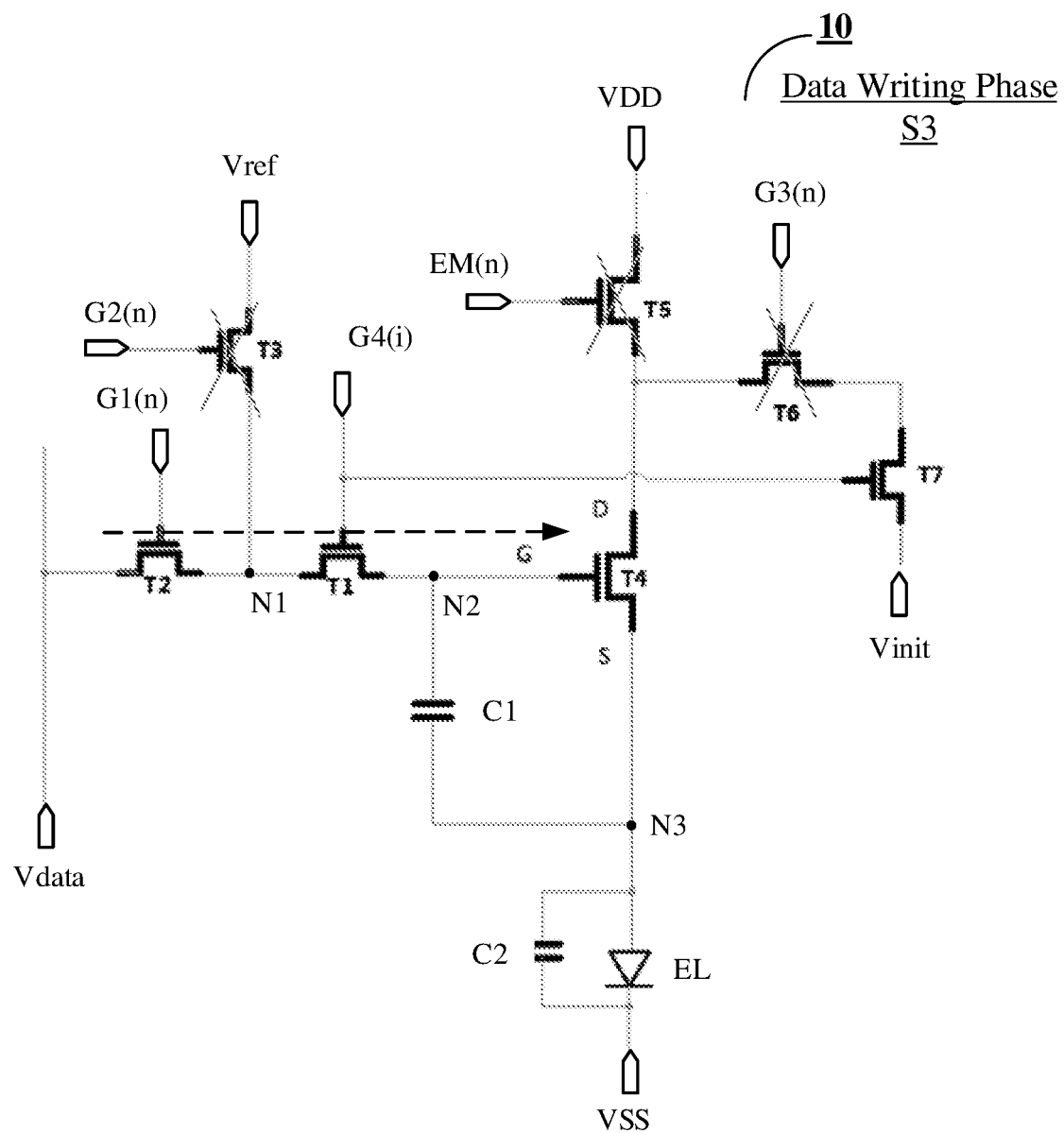
FIG. 10 is a schematic diagram of transistor switch states in a data writing phase of a pixel circuit provided by the embodiments of the present disclosure.
Figure 11:
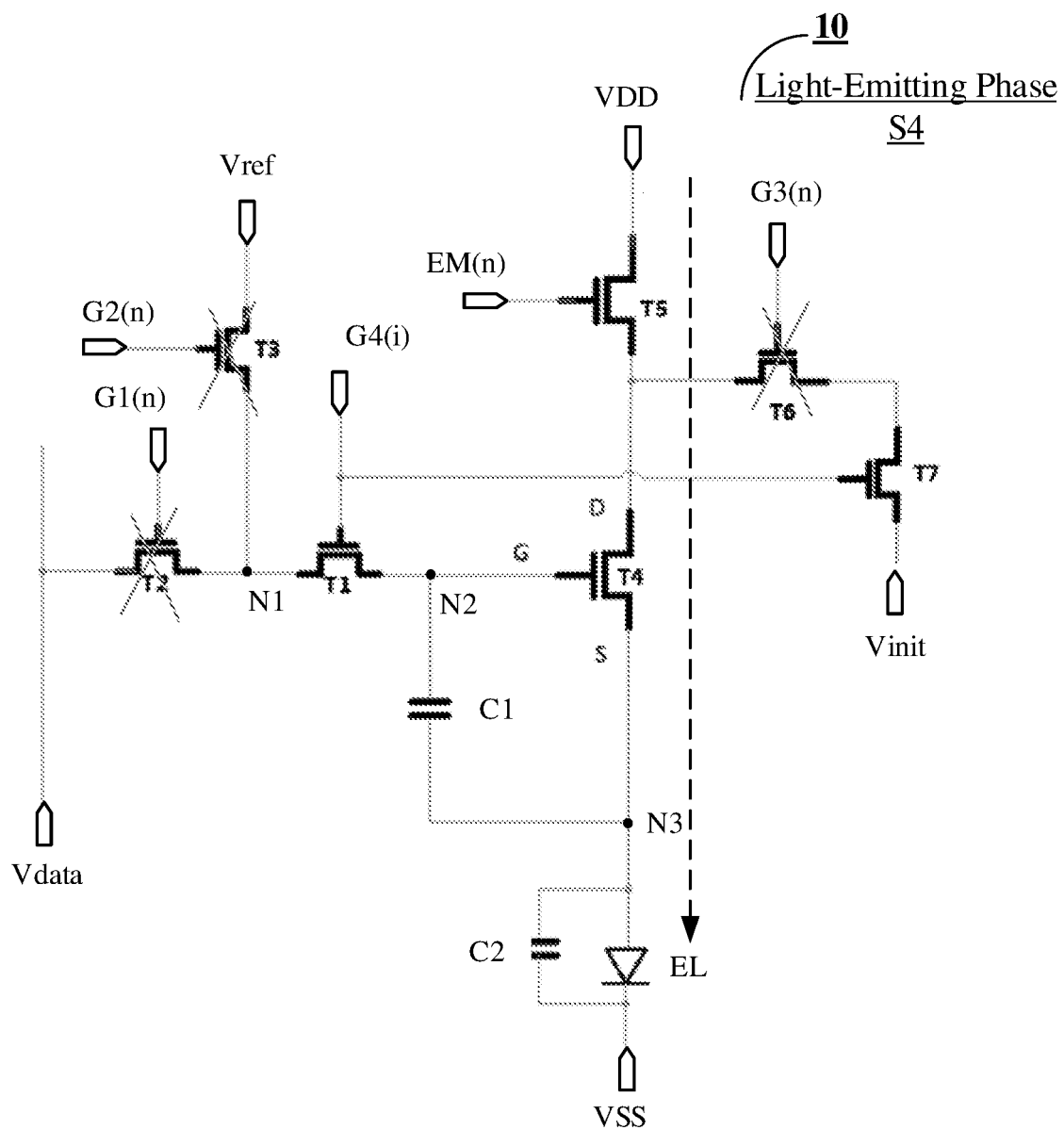
FIG. 11 is a schematic diagram of transistor switch states in a light-emitting phase of a pixel circuit provided by the embodiments of the present disclosure.

FIG. 4 is a timing diagram of a driving method of a pixel circuit provided by an embodiment of the present disclosure. FIG. 5 is a simulation diagram of two frames of a pixel circuit provided by the embodiments of the present disclosure. FIG. 6 and FIG. 7 are respectively enlarged views of a simulation diagram of a first frame and a simulation diagram of a second frame illustrated in FIG. 5. FIG. 8 is a schematic diagram of transistor switch states in a reset phase of a pixel circuit provided by the embodiments of the present disclosure. FIG. 9 is a schematic diagram of transistor switch states in a compensation phase of a pixel circuit provided by the embodiments of the present disclosure. FIG. 10 is a schematic diagram of transistor switch states in a data writing phase of a pixel circuit provided by the embodiments of the present disclosure. FIG. 11 is a schematic diagram of transistor switch states in a light-emitting phase of a pixel circuit provided by the embodiments of the present disclosure.

The embodiments of the present disclosure provide a driving method for the above-mentioned pixel circuit. The driving method of the pixel circuit 10 illustrated in FIG. 3 will be described below with reference to the signal timing diagrams illustrated in FIG. 4 to FIG. 7. As illustrated in FIG. 4, the display process of each frame of image includes four phases, which are a reset phase S1, a compensation phase S2, a data writing phase S3 and a light-emitting phase S4, respectively, and the timing waveforms of the respective signals in each of these phases are illustrated in the figures. The transistors illustrated in FIG. 4 to FIG. 11 are all N-type transistors, that is, each N-type transistor is turned on when the gate electrode is connected to a high level, and is turned off when the gate electrode is connected to a low level. The following embodiments are identical thereto and will not be repeated herein.

As illustrated in FIG. 2 to FIG. 8, in the reset phase S1, the second control signal, the partition control signal and the third control signal are input, and the reset circuit 300 and the partition control circuit 600 are turned on to reset the control terminal 130 of the driving circuit 100 and reset one terminal, connected to the second output terminal 320 of the reset circuit 300, of the first terminal 110 and the second terminal 120 of the driving circuit 100.

For example, as illustrated in FIG. 2 to FIG. 8, in the reset phase S1, the second control signal transmitted by the second control signal line is at a high level, and the third reset transistor T3 is turned on by the high level of the second control signal; the partition control signal transmitted by the partition control signal line is at a high level, and the partition control transistor T1 and the first reset transistor T7 are turned on by the high level of the partition control signal; the third control signal transmitted by the third control signal line is at a high level, and the second reset transistor T6 is turned on by the high level of the third control signal; the light-emitting control signal transmitted by the light-emitting control signal line is at a low level, and the light-emitting control transistor T5 is turned off by the low level of the light-emitting control signal; and the first control signal transmitted by the first control signal line is at a low level, and the data writing transistor T2 is turned off by the low level of the first control signal.

For example, as illustrated in FIG. 4 and FIG. 8, a reset path is formed during the reset phase (as illustrated by the dotted lines with arrows in FIG. 8). During this phase, the reference voltage Vref is written to the gate electrode of the driving transistor T4 through the third reset transistor T3 and the partition control transistor T1 that are turned on to reset the gate electrode, and the initialization voltage Vinit is written to the first electrode of the driving transistor T4 through the second reset transistor T6 and the first reset transistor T7 that are turned on to reset the first electrode of the driving transistor T4.

In some examples, as illustrated in FIG. 2, FIG. 4 and FIG. 8, the second output terminal 320 of the reset circuit 300 is connected to the first terminal 110 of the driving circuit 100; during the reset phase S1, the driving circuit 100 is turned on, and both the first terminal 110 and the second terminal 120 of the driving circuit 100 are reset.

For example, as illustrated in FIG. 4 and FIG. 8, during the reset phase S1, the driving transistor T4 is turned on, and the initialization voltage is written to the second electrode of the driving transistor T4 through the driving transistor T4 that is turned on to reset the second electrode of T4, that is, the third Node N3. For example, during the reset phase S1, the first reset transistor T7, the second reset transistor T6 and the driving transistor T4 are all turned on, and the first electrode of the light-emitting element EL is reset.

For example, during the reset phase S1, the light-emitting control transistor T5 is turned off to fully reset the third node N3.

As illustrated in FIG. 2, FIG. 4 and FIG. 9, during the compensation phase S2, the second control signal, the light-emitting control signal and the partition control signal are input, the reset circuit 300, the partition control circuit 600 and the driving circuit 100 are kept to be turned on, and the light-emitting control circuit 400 is turned on, so the second terminal 120 of the driving circuit 100 can be compensated by the voltage of the first voltage terminal VDD. The above-mentioned the reset circuit 300 being kept to be turned on refers to keeping the first output terminal of the reset circuit to output signal, for example, the second output terminal of the reset circuit is turned off.

For example, as illustrated in FIG. 4 and FIG. 9, the second control signal transmitted by the second control signal line is at a high level, and the third reset transistor T3 is kept to be turned on; the partition control signal transmitted by the partition control signal line is at a high level, and the partition control transistor T1 and the first reset transistor T7 are kept to be turned on; the third control signal transmitted by the third control signal line is at a low level, and the second reset transistor T6 is turned off by the low level of the third control signal; the light-emitting control signal transmitted by the light-emitting control signal line is at a high level, and the light-emitting control transistor T5 is turned on by the high level of the light-emitting control signal; the first control signal transmitted by the first control signal line is at a low level, and the data writing transistor T2 is turned off by the low level of the first control signal; and the driving transistor T4 is kept to be turned on.

For example, as illustrated in FIG. 4 and FIG. 9, a compensation path is formed during the compensation phase (as illustrated by the dotted lines with arrows in FIG. 9). During this phase, the third reset transistor T3 is kept to be turned on, the voltage of the gate electrode of the driving transistor T4 maintains the reference voltage Vref, and the driving transistor T4 is kept to be turned on. Because the light-emitting control transistor T5 is turned on, the first voltage terminal VDD charges the third node N3, that is, the second electrode of the driving transistor T4 and the second electrode plate of the first capacitor C1 through the light-emitting control transistor T5 and the driving transistor T4 that are turned on. When the gate-source voltage difference Vgs of the driving transistor T4 is equal to the threshold voltage Vth of the driving transistor T4, the driving transistor T4 is turned off, and the charging ends. In this case, the voltage of the third node N3 is Vref−Vth.

For example, the voltage of the second node N2 is $V_N$, the voltage of the third node N3 is $V_S$, and the gate-source voltage difference of the driving transistor T4 is Vgs; during the compensation phase S2, $V_N$=Vref, the first voltage terminal VDD charges the second capacitor C2 until $V_S$=Vref−Vth, in this case, the gate-source voltage difference of the driving transistor T4 is: Vgs=$V_N$−$V_S$=Vref−(Vref−Vth)=Vth, and Vref is set to: Vref>Vth+Vini, which can cause the driving transistor T4 to be turned on to complete the compensation charging.

For example, the compensation time is the turn-on time of the third reset transistor T3 minus the turn-on time of the second reset transistor T6, and the gate driving circuit can be turned on for a long time by pulse width debugging to complete long-time compensation.

For example, when setting the reference voltage Vref, according to the specification of the threshold voltage Vth of the driving transistor T4, ensure that $V_S$<V0, where V0 is the turn-on voltage of the light-emitting element EL. That is, Vref−Vth<V0, Vref<V0+Vth, and Vref<V0 are sufficient.

As illustrated in FIG. 2, FIG. 4 and FIG. 10, during the data writing phase S3, the first control signal and the partition control signal are input to keep the partition control circuit 600 turned on, and the data writing circuit 200 is turned on to apply the data voltage to the control terminal 130 of the driving circuit 100.

For example, as illustrated in FIG. 4 and FIG. 10, the second control signal transmitted by the second control signal line is at a low level, and the third reset transistor T3 is turned off by the low level of the second control signal; the partition control signal transmitted by the partition control signal line is at a high level, and the partition control transistor T1 and the first reset transistor T7 are kept to be turned on; the third control signal transmitted by the third control signal line is at a low level, and the second reset transistor T6 is turned off by the low level of the third control signal; the light-emitting control signal transmitted by the light-emitting control signal line is at a low level, and the light-emitting control transistor T5 is turned off by the low level of the light-emitting control signal; and the first control signal transmitted by the first control signal line is at a high level, and the data writing transistor T2 is turned on by the high level of the first control signal.

For example, as illustrated in FIG. 4 and FIG. 10, a data writing and holding path (as illustrated by a dotted line with an arrow in FIG. 10) is formed during the data writing phase. During this phase, the data writing transistor T2 and the partition control transistor T1 are turned on, the voltage of the second node N2 jumps from Vref to Vdata, the voltage of the first electrode plate of the first capacitor C1 jumps by Vdata−Vref, the voltage of the second electrode plate of the first capacitor C1 produces a corresponding jump under the bootstrap action, that is, the third node N3 is capacitively coupled, and the voltage on the third node N3 changes to: VS=α (Vdata−Vref)+Vref−Vth. For example, in the above formula, a is a coefficient, for example, α=C1/(C1+C2), in this formula, C1 is the capacitance value of the first capacitor C1, C2 is the capacitance value of the second capacitor C2, and C2 can also be regarded as the intrinsic capacitance value of the light-emitting element. After the data writing phase S3 ends, the voltage of the second node N2 is Vdata, and the voltage of the second node N3 is a (Vdata−Vref)+Vref−Vth.

As illustrated in FIG. 2, FIG. 4 and FIG. 11, during the light-emitting phase S4, the light-emitting control signal and the partition control signal are input to keep the partition control circuit 600 turned on, and the light-emitting control circuit 400 and the driving circuit 100 are turned on to generate a driving current, which in turn drives the light-emitting element 500 to emit light.

For example, as illustrated in FIG. 4 and FIG. 11, the second control signal transmitted by the second control signal line is at a low level, and the third reset transistor T3 is turned off by the low level of the second control signal; the partition control signal transmitted by the partition control signal line is at a high level, and the partition control transistor T1 and the first reset transistor T7 are kept to be turned on; the third control signal transmitted by the third control signal line is at a low level, and the second reset transistor T6 is turned off by the low level of the third control signal; the light-emitting control signal transmitted by the light-emitting control signal line is at a high level, and the light-emitting control transistor T5 is turned on by the high level of the light-emitting control signal; and the first control signal transmitted by the first control signal line is at a low level, and the data writing transistor T2 is turned off by the low level of the first control signal.

For example, as illustrated in FIG. 4 and FIG. 11, a pre-light-emitting path is formed during the light-emitting phase (as illustrated by a dotted line with an arrow in FIG. 11). During this phase, the light-emitting control transistor T5, the partition control transistor T1 and the first reset transistor T7 are turned on, and the data writing transistor T2, the third reset transistor T3 and the second reset transistor T6 are turned off. In this case, the driving current Id is:

$$Id=K*[(1-\alpha)*(Vdata-Vref)]^2$$

It can be seen from the above formula that the driving current is related to the data signal Vdata and the reference voltage Vref, and the influence of the threshold voltage Vth of the driving transistor T4 on the driving current can be successfully eliminated, so that the driving current can be avoided from being affected by the nonuniformity and drift of the threshold voltage, thereby effectively improving the uniformity of the driving current. In addition, because the driving current is independent of the first voltage VDD and independent of the second voltage VSS, the influence of the voltage drop of the power line providing the first voltage and the voltage drop of the power line providing the second voltage on the driving current can be effectively avoided.

According to $\alpha=C1/(C1+C2)$, it can be seen that the greater the capacitance value of the second capacitor C2 is, the smaller a is, and the more energy is saved.

For example, the voltage drop of the light-emitting control transistor T5 affects the first voltage VDD and the linear region of the light-emitting control transistor T5, setting that: EM>VDD+Vth_em, in which Vth_em is the threshold voltage of the light-emitting control transistor T5.

The working process of the pixel circuit illustrated in FIG. 4, FIG. 8 to FIG. 11 is the working process when the partition control signal is at a high level, that is, the working process during the first frame of display time illustrated in FIG. 5 and FIG. 6.

For example, as illustrated in FIG. 5 to FIG. 7, the partition control signal G4 performs switching on and off actions in a frame cycle, so the partition control signal G4 in one frame is always at a high level (the first frame illustrated in FIG. 6) or is always at a low level (the second frame illustrated in FIG. 7), the partition control circuit in one frame is always in the turn-on state or turn-off state, and the partition control transistor and the first reset transistor are always in the turn-on state or turn-off state.

For example, as illustrated in FIG. 5 to FIG. 7 and FIG. 10, during the first frame of display time, the partition control signal is always at a high level; and in the data writing phase during the first frame of display time, the first control signal terminal G1 outputs a high-level signal, the data writing transistor T2 is turned on, the voltage of the second node N2 jumps from Vref to Vdata, and the voltage of the third node N3 changes to a (Vdata−Vref)+Vref−Vth. Thereafter, both the voltage of the second node N2 and the voltage of the third node N3 gradually increase to a constant value.

For example, as illustrated in FIG. 5 to FIG. 7 and FIG. 10, during the second frame of display time, the partition control signal is always at a low level, and the level states of the first control signal, the second control signal and the light-emitting control signal in each phase are identical to the level states of the first control signal, the second control signal and the light-emitting control signal in each phase during the first frame of display time. However, because the partition control signal is at a low level, the partition control circuit and the first reset transistor are both in the turn-off state, the voltages at the second node N2 and the third node N3 in this pixel circuit remain almost constant.

For example, as illustrated in FIG. 5, during the first frame of display time, the partition control signal is always at a high level, and in the compensation phase and data writing phase, the driving current Id of the light-emitting element fluctuates; and during the second frame of display time, the partition control signal is always at a low level, and the driving current Id of the light-emitting element is substantially unchanged.

Figure 12:
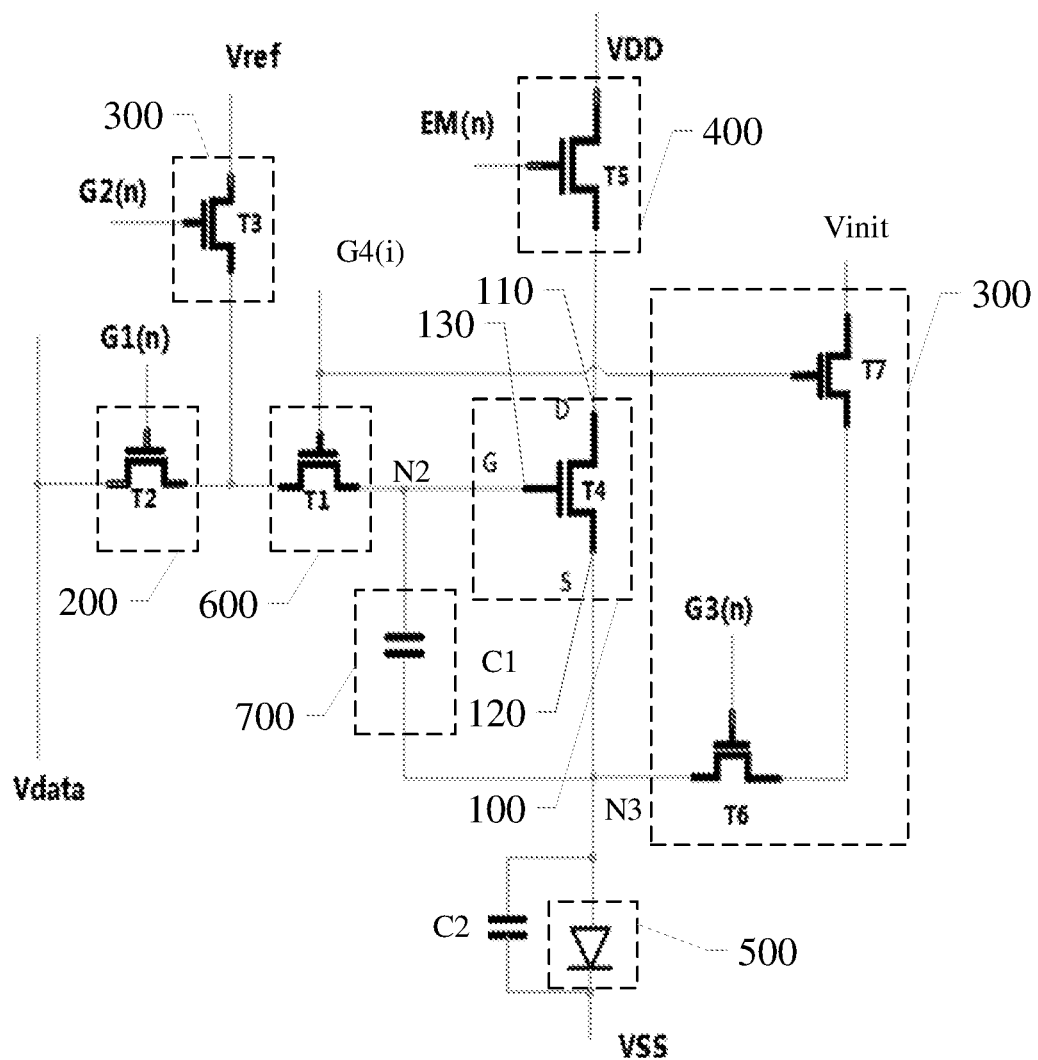
FIG. 12 is a schematic diagram of a pixel circuit provided by another example of the embodiments of the present disclosure.

FIG. 12 is a schematic diagram of a pixel circuit provided by another example of the embodiments of the present disclosure. The difference between the pixel circuit illustrated in FIG. 12 and the pixel circuit illustrated in FIG. 2 is that the second output terminal of the reset circuit 300 is connected to the first terminal and the second terminal of the driving circuit 100. As illustrated in FIG. 12, the second output terminal of the reset circuit 300 is connected to the second terminal of the driving circuit 100.

In some examples, as illustrated in FIG. 12, the first terminal of the storage circuit 700 is connected to the second node N2, the second terminal of the storage circuit 700 is connected to the third node N3, the control terminal of the driving circuit 100 is connected to the second node N2, the second terminal of the driving circuit 100 is connected to the third node N3; and the second output terminal of the reset circuit 300 is connected to the third node N3.

For example, the connection relationship of the driving transistor T4, the data writing transistor T2, the partition control transistor T1, the third reset transistor T3, the light-emitting control transistor T5, the first capacitor C1 and the second capacitor C2 in the pixel circuit illustrated in FIG. 12 may be identical to the corresponding connection relationship in the pixel circuit illustrated in FIG. 2, which will not be repeated herein. For example, the connection relationship between the first reset transistor T7 and the second reset transistor T6 in the pixel circuit illustrated in FIG. 12 may be identical to the corresponding connection relationship in the pixel circuit illustrated in FIG. 2, which will not be repeated herein.

The timing diagram corresponding to the pixel circuit illustrated in FIG. 12 may be identical to the timing diagram illustrated in FIG. 4. For example, a driving method for driving the pixel circuit illustrated in FIG. 12 includes a reset phase S1, a compensation phase S2, a data writing phase S3 and a light-emitting phase S4.

For example, as illustrated in FIG. 12, in the reset phase, the partition control circuit 600 applies a reference voltage to the control terminal 130 of the driving circuit 100 in response to the partition control signal, and the reset circuit 300 applies an initialization voltage to the third node N3 in response to the partition control signal and the third control signal to reset the second terminal 120 of the driving circuit 100 and the light-emitting element 500. For example, the resetting of the third node during the reset phase may be performed without passing through the driving circuit 100. For example, the initialization signal can reset the first terminal of the driving circuit 100 through the driving circuit 100 that is turned on, for example, the initialization signal can reset the first terminal of the driving transistor T4 through the driving transistor T4 that is turned on.

For example, the working processes of the pixel circuit illustrated in FIG. 12 during the compensation phase S2, the data writing phase S3, and the light-emitting phase S4 may be identical to the working processes of the pixel circuit illustrated in FIG. 2 during the corresponding phases, which will not be repeated herein.

Figure 13:
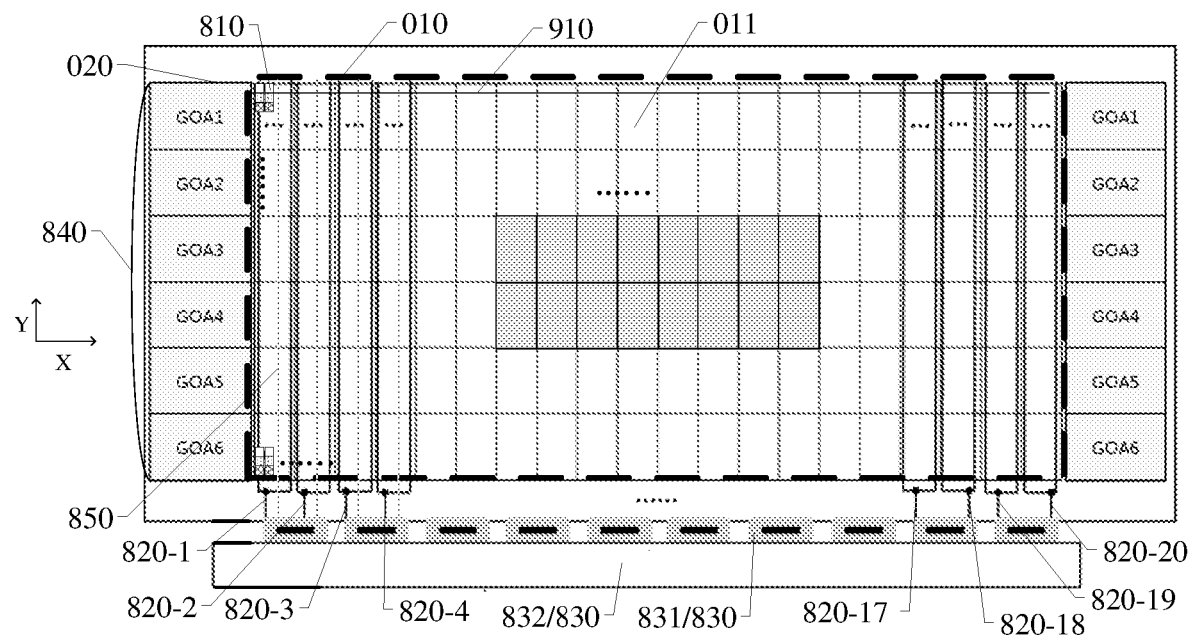
FIG. 13 is a schematic diagram of a partial structure of a display device provided by another embodiment of the present disclosure.

FIG. 13 is a schematic diagram of a partial structure of a display device provided by another embodiment of the present disclosure.

As illustrated in FIG. 13, the display device includes a display region 010 and a peripheral region 020 around the display region 010. For example, the display region 010 is a region for displaying images, and the peripheral region 020 is a region for not displaying images, for example, the peripheral region 020 surrounds the display region 010.

As illustrated in FIG. 2 to FIG. 13, the display device includes a plurality of sub-pixels 810 in the display region 010, and at least part of the sub-pixels 810 respectively include the pixel circuit 10 illustrated in any of the above-mentioned examples in FIG. 2 to FIG. 12.

As illustrated in FIG. 2 to FIG. 13, the display device further includes a plurality of partition control signal lines 820 for transmitting partition control signals to the partition control circuit 600 and the reset circuit 300 in the sub-pixel 810 to control whether the sub-pixel 810 refreshes the signal. For example, at least part of the partition control signal lines 820 are in the display region 010.

As illustrated in FIG. 13, the display region 010 includes a plurality of sub-regions 011. For example, each sub-region 011 includes a plurality of sub-pixels 810. For example, each sub-region 011 includes a plurality of rows and columns of sub-pixels 810. For example, each sub-region 011 includes at least 50 sub-pixel columns, and the sub-pixels in each sub-pixel column are arranged along a second direction, such as the Y direction as illustrated in the figure. For example, each sub-region 011 includes at least 100 sub-pixel columns. For example, each sub-region 011 includes at least 150 sub-pixel columns. For example, each sub-region 011 includes at least 200 sub-pixel columns. For example, each sub-region 011 includes at least 300 sub-pixel columns. For example, each sub-region 011 includes at least 350 sub-pixel columns. For example, each sub-region 011 includes at least 400 sub-pixel columns.

As illustrated in FIG. 13, the partition control circuits 600 of the sub-pixels 810 in at least two sub-regions 011 are electrically connected to different partition control signal lines 820.

For example, as illustrated in FIG. 13, the level of the signal transmitted on the partition signal line 820 can be controlled so that the display image of at least one sub-region 011 is updated independently when the display images of other sub-regions 011 are not updated. For example, when the signal transmitted on the partition control signal line 820 is at a high level, the display image in the sub-region 011 is updated; and when the signal transmitted on the partition control signal line 820 is at a low level, the display image in the sub-region 011 remains unchanged.

For example, as illustrated in FIG. 13, when all the sub-regions 011 in the display region 010 update the display image, the refresh frequency adopted may be 60 Hz, and when some sub-regions 011 in the display region 010 update the display image while the other sub-regions 011 do not update the display image, the refresh frequency may be higher than 60 Hz, such as 120 Hz, thereby achieving an ultra-high refresh frequency.

For example, as illustrated in FIG. 13, in the case where the sub-pixels 810 in different sub-regions 011 are controlled by the partition control signal line 820, it is possible to individually perform local refreshing according to the viewing requirements of the human eye, for example, after locating the human eye using the eye tracking technology, adopt a high-definition original resolution for the image of the sub-region 011 at the position of the focusing point of the human eye within the display region 010, and adopt a reduced resolution mode for the image of the sub-region 011 at the position of the non-focusing point of the human eye within the display region 010, so as to achieve a high resolution for the sub-region in which the position of the focusing point of the human eye is located, and to greatly reduce the power consumption for the display.

In the display device provided by the present disclosure, by electrically connecting the sub-pixels in at least two different sub-regions of the display region to different partition control signal lines to control whether the display images of the sub-pixels in different sub-regions are refreshed or not, and control parameters such as the refresh frequency, and the display resolution, it is beneficial to achieve partition display, achieve high refresh rate and high resolution in at least part of the sub-regions, and further reduce power consumption of the display device at the same time.

In some examples, as illustrated in FIG. 13, the display device further includes a circuit board 830 and a gate driving circuit structure 840 that are in the peripheral region 020. For example, the circuit board 830 includes a plurality of first circuit boards 831, and the plurality of first circuit boards 831 are arranged along a first direction. For example, the first circuit board 831 may be a flexible printed circuit (FPC) or a chip on film (COF).

For example, the gate driving circuit structure 840 includes a plurality of gate driving circuits, such as Gate Driven on Array (GOA), and the plurality of gate driving circuits on one side of the display region 010 in the first direction are arranged along the second direction. For example, the display device includes gate driving circuit structures 840 on both sides of the display region 010 in the first direction. The embodiments of the present disclosure schematically illustrate that the first direction is the X direction illustrated in FIG. 13, and the second direction is the Y direction illustrated in FIG. 13, but the embodiments are not limited thereto, and the first direction and the second direction can be interchanged. For example, the second direction intersects with the first direction. For example, the second direction is perpendicular to the first direction.

In some examples, as illustrated in FIG. 13, the display device further includes a plurality of data lines 850 and a plurality of first control signal lines 910 in the display region 010. For example, the plurality of data lines 850 are arranged along the first direction. For example, the plurality of first control signal lines 910 are arranged along the second direction. For example, the circuit board 830 is configured to provide the partition control signal for the partition control signal line 820, the circuit board 830 is configured to provide the data signal for the data line 850, and the gate driving circuit structure 840 is configured to provide the first control signal for the first control signal line 910.

For example, as illustrated in FIG. 2 to FIG. 13, the first control signal line 910 is configured to be electrically connected to the data writing circuit 200, for example, the first control signal line 910 is electrically connected to the gate electrode of the data writing transistor T2. For example, the first control signal line 910 may be a scanning signal line. For example, the data line 850 is configured to be electrically connected to the data writing circuit 200, for example, the data line 850 is electrically connected to the first electrode of the data writing transistor T2. For example, the partition control signal line 820 may be a common scanning signal line.

For example, as illustrated in FIG. 13, the first circuit board 831 may include a data driver integrated circuit, such as a source driver IC, and the data line 850 is electrically connected to the output terminal of the data driver integrated circuit.

For example, as illustrated in FIG. 13, the circuit board 830 further includes a second circuit board 832, and the partition control signal line 820 is electrically connected to the second circuit board 832. For example, the first circuit board 831 is provided with a plurality of wires at locations other than the data driver integrated circuit, and the partition control signal line 820 is electrically connected to the second circuit board 832 through the plurality of wires at the above-mentioned locations other than the data driver integrated circuit in the first circuit board 831. For example, the second circuit board 832 may be a printed circuit board (PCB). For example, the display device may further include a timing controller (TCON), and the timing controller provides a driving control signal to the circuit board 830.

For example, the display device further includes a plurality of second control signal lines and a plurality of third control signal lines, and the plurality of second control signal lines and the plurality of third control signal lines are arranged along the second direction. For example, the second control signal line is configured to be electrically connected to the gate electrode of the third reset transistor T3, and the third control signal line is configured to be electrically connected to the gate electrode of the second reset transistor T6. For example, the display device further includes a plurality of light-emitting control signal lines, and the plurality of light-emitting control signal lines are arranged along the second direction. For example, the light-emitting control signal line is configured to be electrically connected to the gate electrode of the light-emitting control transistor T5. For example, the light-emitting control signal line is electrically connected to the gate driving circuit structure 840.

Figure 14:
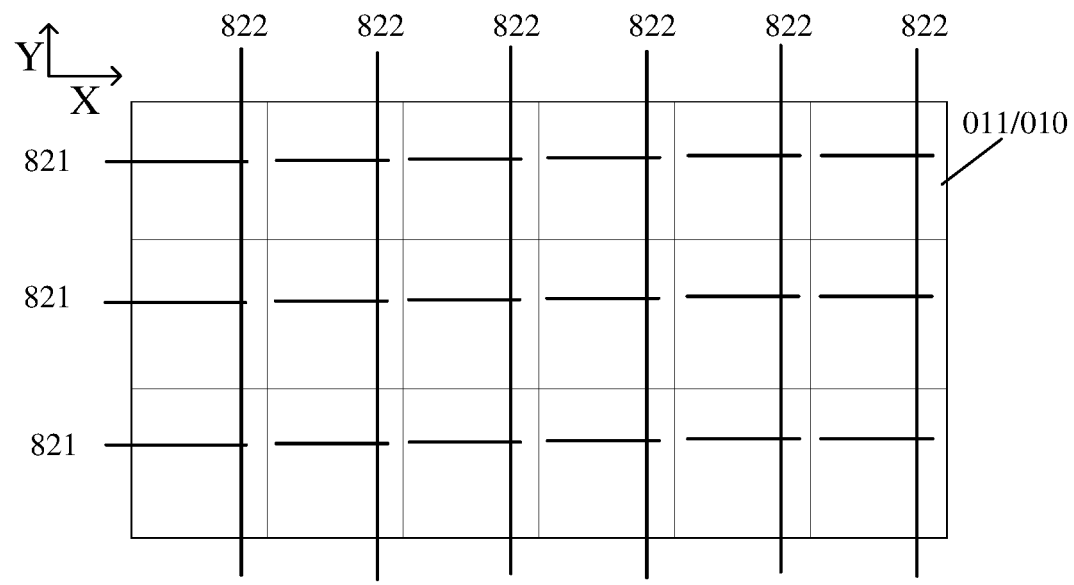
FIG. 14 is a simplified schematic diagram of partition control signal lines in the display device illustrated in FIG. 13.

FIG. 14 is a simplified schematic diagram of the partition control signal lines in the display device illustrated in FIG. 13.

In some examples, as illustrated in FIG. 2, FIG. 13 and FIG. 14, the plurality of partition control signal lines 820 include a plurality of first partition control signal lines 821 and a plurality of second partition control signal lines 822, the first partition control signal line 821 extends along the first direction, the second partition control signal line 822 extends along the second direction, and one first partition control signal line 821 is electrically connected to the circuit board 830 through at least one second partition control signal line 822; and the control terminals of the partition control circuits 600 of the sub-pixels 810 in the same sub-region 011 are electrically connected to the same first partition control signal line 821, and are insulated from different first partition control signal lines 821 electrically connected to the sub-pixels 810 in different sub-regions 011.

For example, as illustrated in FIG. 14, a spacing is provided between two first partition control signal lines 821, corresponding to adjacent sub-regions 011 arranged in the first direction, extending in the first direction and crossed by the same straight line.

For example, as illustrated in FIG. 13 and FIG. 14, the partition control signal lines 820 corresponding to the sub-regions 011 arranged along the first direction are arranged at intervals. For example, the partition control signal terminals of the plurality of sub-pixels 810 in each sub-region 011 are electrically connected together. For example, the partition control signal lines 820 corresponding to the same column of sub-regions 011 are electrically connected together. For example, the sub-regions 011 in the same column of sub-regions 011 are arranged along the second direction, such as the Y direction. The embodiments of the present disclosure are not limited thereto, and the row and the column may be interchanged.

For example, as illustrated in FIG. 13, the display region 010 includes p rows and m columns of sub-regions 011, for example, p may be 6, m may be 20, but the embodiments are not limited thereto, p may also be 4, 5 or a positive integer greater than 6, and m may be 10~19, or a positive integer greater than 20. In the next frame of display image, it is necessary to refresh a plurality of sub-regions 011 included in the gray part in the figure, but the other sub-regions 011 are not refreshed, then during a blank phase, the partition control signals input by the partition control signal line 820-1 corresponding to the first column of sub-regions 011, the partition control signal line 820-2 corresponding to the second column of sub-regions 011, the partition control signal line 820-3 corresponding to the third column of sub-regions 011, the partition control signal line 820-4 corresponding to the fourth column of sub-regions 011, the partition control signal line 820-5 corresponding to the fifth column of sub-regions 011, the partition control signal line 820-6 corresponding to the sixth column of sub-regions 011, the partition control signal line 820-20 corresponding to the 20th column of sub-regions 011, the partition control signal line 820-19 corresponding to the 19th column of sub-regions 011, the partition control signal line 820-18 corresponding to the 18th column of sub-regions 011, the partition control signal line 820-17 corresponding to the 17th column of sub-regions 011, the partition control signal line 820-16 corresponding to the 16th column of sub-regions 011, and the partition control signal line 820-15 corresponding to the 15th column of sub-regions 011 are all set to a low level, and the partition control signals input by the partition control signal lines corresponding to the other columns of sub-regions 011 are all set to a high level, thus the partition control transistors and the first reset transistors of the sub-pixels in the first column of sub-regions 011, the second column of sub-regions 011, the third column of sub-regions 011, the fourth column of sub-regions 011, the fifth column of sub-regions 011, the sixth column of sub-regions 011, the 15th column of sub-regions 011, the 16th column of sub-regions 011, the 17th column of sub-regions 011, the 18th column of sub-regions 011, the 19th column of sub-regions 011 and the 20th column of sub-regions 011 are all turned off, and the display images in these columns of sub-regions 011 are not refreshed, while the partition control transistors and the first reset transistors of the sub-pixels 810 in the other columns of sub-regions 011 are turned on, and the sub-pixels 810 in specific rows of sub-regions 011 in the other columns of sub-regions 011 are controlled to refresh the data through the GOA in the gate driving circuit structure 840, for example, the sub-pixels 810 in the third row of sub-regions 011 driven by GOA3, and sub-pixels in the fourth row of sub-regions 011 driven by GOA4 (the gray region in the figure) are subjected to an individual data refreshing and internal compensating operation during the next frame to achieve the effect of a local refresh of the partition.

Figure 15:
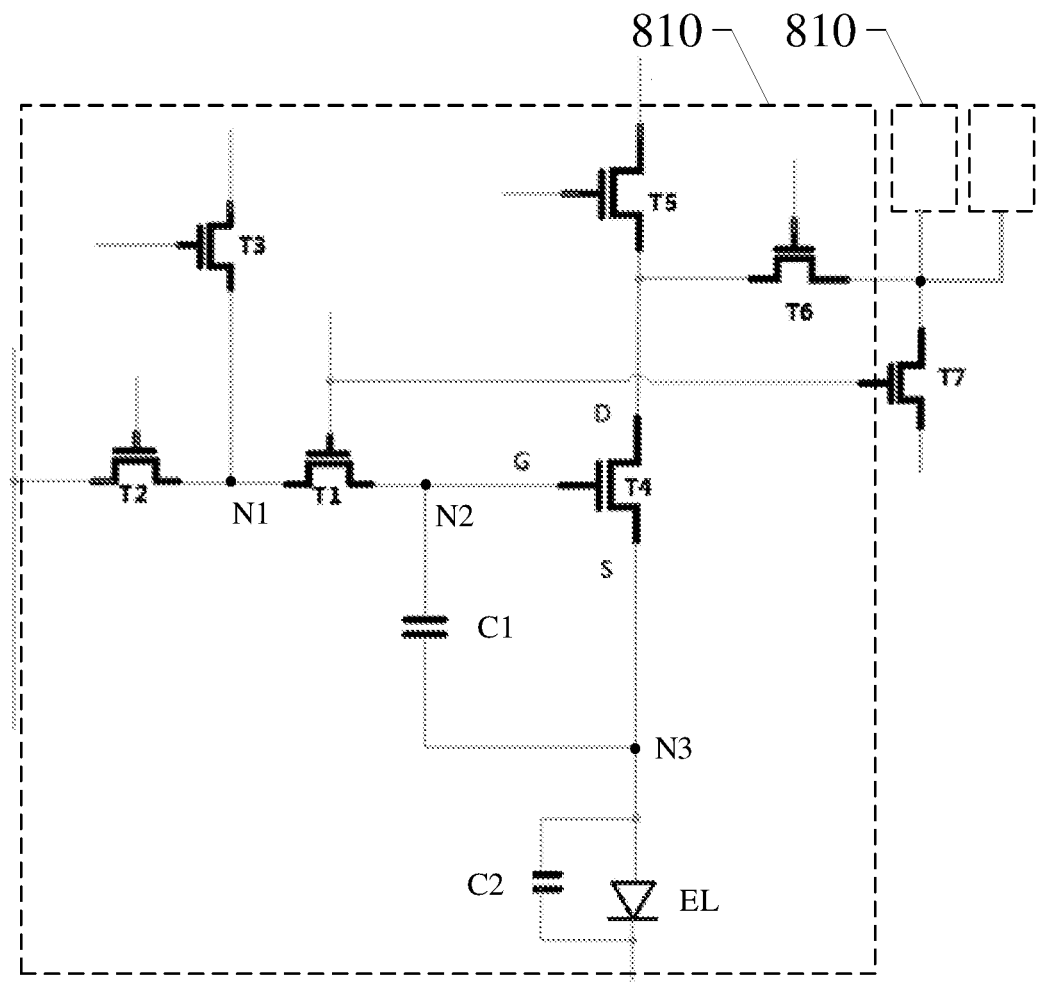
FIG. 15 and FIG. 16 are pixel circuit diagrams of a plurality of sub-pixels in different examples of the display device illustrated in FIG. 13.
Figure 16:
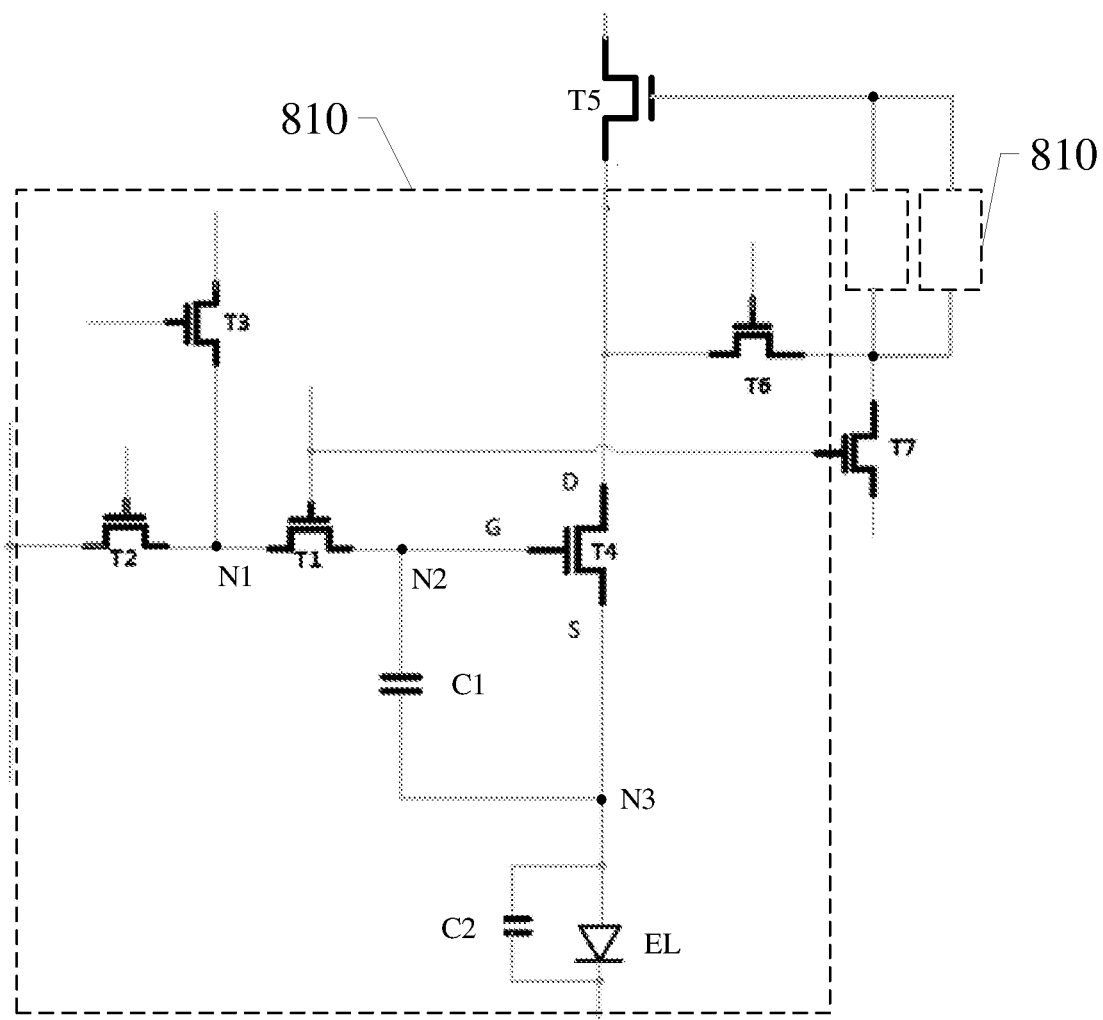

FIG. 15 and FIG. 16 are pixel circuit diagrams of a plurality of sub-pixels in different examples of the display device illustrated in FIG. 13.

In some examples, as illustrated in FIG. 2, FIG. 3 and FIG. 15, the second output terminal 320 of the reset circuit 300 is connected to the first terminal 110 of the driving circuit 100.

In some examples, as illustrated in FIG. 2, FIG. 3 and FIG. 15, the partition control circuit 600 includes a partition control transistor T1, the reset circuit 300 includes a first reset transistor T7, and in the same sub-pixel 810, the gate electrode of the partition control transistor T1 and the gate electrode of the first reset transistor T7 are electrically connected to the same one partition control signal line 820 to receive the partition control signal; and at least two sub-pixels 810 share the same one first reset transistor T7.

For example, as illustrated in FIG. 2, FIG. 3 and FIG. 15, the first electrodes of the second reset transistors T6 of the at least two sub-pixels 810 are connected, and the first electrodes of the at least two second reset transistors T6 are connected to the second electrode of the same one first reset transistor T7.

In the display device provided by the present disclosure, by setting at least two sub-pixels to share the same one first reset transistor, it is beneficial to reduce the total number of transistors, save layout space, and increase the pixels per inch (ppi).

For example, the plurality of sub-pixels 810 includes a plurality of red sub-pixels, a plurality of green sub-pixels and a plurality of blue sub-pixels, and taking one red sub-pixel, one green sub-pixel and one blue sub-pixel as a repeating unit, the first reset transistor T7 is shared by at least two adjacent repeating units, that is, shared by six sub-pixels. For example, in other embodiments, the first reset transistor T7 may also be configured to be shared by three or more repeating units.

For example, as illustrated in FIG. 3 and FIG. 15, except for the first reset transistor T7, other transistors in each sub-pixel 810 are individually owned and not shared by other sub-pixels.

In some examples, as illustrated in FIG. 2, FIG. 3 and FIG. 16, at least two sub-pixels 810 share the same one light-emitting control circuit 400. For example, at least two sub-pixels 810 share the same one light-emitting control transistor T5. For example, at least two sub-pixels 810 not only share the same one first reset transistor T7, but also share the same one light-emitting control transistor T5, which is beneficial to reduce the total number of transistors and increase the pixels per inch (ppi).

For example, as illustrated in FIG. 3 and FIG. 16, except for the first reset transistor T7 and the light-emitting control transistor T5, other transistors in each sub-pixel 810 are individually owned and not shared by other sub-pixels. Of course, the embodiments of the present disclosure are not limited thereto, and at least two sub-pixels 810 may only share the same one light-emitting control transistor T5.

For example, the plurality of sub-pixels 810 includes a plurality of red sub-pixels, a plurality of green sub-pixels and a plurality of blue sub-pixels, and taking one red sub-pixel, one green sub-pixel and one blue sub-pixel as a repeating unit, the light-emitting control transistor T5 is shared by at least two adjacent repeating units, that is, shared by six sub-pixels. For example, in other embodiments, the light-emitting control transistor T5 may also be configured to be shared by three or more repeating units.

For example, as illustrated in FIG. 3 and FIG. 16, the second electrodes of the second reset transistor T6 of the at least two sub-pixels 810 are connected, and the second electrodes of the at least two second reset transistors T6 are connected to the second electrode of the same one light-emitting control transistor T5.

For example, the display device provided by the embodiments of the present disclosure may be a large-sized display device, for example, the display device may have a display screen larger than 30 inches. For example, the display device may have a display screen larger than 40 inches. For example, the display device may have a display screen larger than 50 inches. For example, the display device may have a display screen larger than 60 inches. For example, the display device may have a display screen larger than 80 inches. For example, the display device may be used for a vehicle display, or a TV, and the like.

For example, the display device provided by the embodiments of the present disclosure may be an organic light-emitting diode display device, such as an active-matrix organic light-emitting diode (AMOLED) display device.

For example, the display device may further include a cover plate on a display side of the display substrate.

For example, the display device may include any product or component with a display function such as a mobile phone, a tablet computer, a notebook computer, a navigator, etc., which is not limited in the embodiments of the present disclosure.

The following statements should be noted:

(1) The drawings of the present disclosure involve only the structure(s) in connection with the embodiment(s) of the present disclosure, and other structure(s) can be referred to common design(s).

(2) In case of no conflict, features in one embodiment or in different embodiments can be combined.

What have been described above are only exemplary embodiments of the present disclosure, and are not intended to limit the protection scope of the present disclosure, and the protection scope of the present disclosure is determined by the appended claims.

The invention claimed is:

1. A pixel circuit, comprising:
   a driving circuit, a data writing circuit, a reset circuit, a light-emitting control circuit and a light-emitting element,
   wherein the driving circuit comprises a control terminal, a first terminal and a second terminal, and the driving circuit is configured to control a driving current flowing through the first terminal and the second terminal for driving the light-emitting element to emit light;
   the light-emitting control circuit is connected to the first terminal of the driving circuit and a first voltage terminal, and is configured to apply a voltage of the first voltage terminal to the first terminal of the driving circuit in response to a light-emitting control signal;
   a first terminal of the light-emitting element is configured to receive the driving current, and a second terminal of the light-emitting element is connected to a second voltage terminal;
   an input terminal of the data writing circuit is connected to a data line, an output terminal of the data writing circuit is connected to a first node, and the data writing circuit is configured to apply a data voltage to the first node in response to a first control signal;
   a first output terminal of the reset circuit is connected to the first node, and the reset circuit is configured to apply a reference voltage to the first node in response to a second control signal;
   the pixel circuit further comprises a partition control circuit, the partition control circuit comprises a first terminal and a second terminal, the first terminal of the partition control circuit is connected to the first node, the second terminal of the partition control circuit is connected to the control terminal of the driving circuit, and the partition control circuit is configured to apply at least one of the data voltage and the reference voltage to the control terminal of the driving circuit in response to a partition control signal; and
   a second output terminal of the reset circuit is connected to one of the first terminal and the second terminal of the driving circuit, and the reset circuit is further configured to apply an initialization voltage to one terminal, connected to the second output terminal, of the first terminal and the second terminal of the driving circuit in response to the partition control signal and a third control signal.

2. The pixel circuit according to claim 1, wherein the partition control circuit comprises a partition control transistor, the reset circuit comprises a first reset transistor, and a gate electrode of the partition control transistor and a gate electrode of the first reset transistor are electrically connected to a same partition control signal line to receive the partition control signal.

3. The pixel circuit according to claim 2, wherein the reset circuit further comprises a second reset transistor, and a gate electrode of the second reset transistor is configured to receive the third control signal.

4. The pixel circuit according to claim 3, wherein an input terminal of the first reset transistor is connected to a reset signal line, an output terminal of the first reset transistor is connected to a first terminal of the second reset transistor, and a second terminal of the second reset transistor is the second output terminal.

5. The pixel circuit according to claim 2, wherein the gate electrode of the partition control transistor is connected to the partition control signal line to receive the partition control signal, a first electrode of the partition control transistor is connected to the first node, and a second electrode of the partition control transistor is connected to the control terminal of the driving circuit.

6. The pixel circuit according to claim 1, wherein the second output terminal of the reset circuit is connected to the first terminal of the driving circuit.

7. The pixel circuit according to claim 1, further comprising a storage circuit, a first terminal of the storage circuit is connected to a second node, a second terminal of the storage circuit is connected to a third node, the control terminal of the driving circuit is connected to the second node, and the second terminal of the driving circuit is connected to the third node.

8. The pixel circuit according to claim 7, wherein the light-emitting control circuit comprises a light-emitting control transistor, the driving circuit comprises a driving transistor, a gate electrode of the light-emitting control transistor is connected to a light-emitting control signal line to receive the light-emitting control signal, a first electrode of the light-emitting control transistor is connected to the first voltage terminal, a second electrode of the light-emitting control transistor is connected to a first electrode of the driving transistor, a gate electrode of the driving transistor is connected to the second node, and a second electrode of the driving transistor is connected to the third node.

9. The pixel circuit according to claim 7, wherein the storage circuit comprises a first capacitor, a first electrode plate of the first capacitor is connected to the second node, and a second electrode plate of the first capacitor is connected to the third node; and the pixel circuit comprises a second capacitor, a first electrode plate of the second capacitor is connected to the first terminal of the light-emitting element, a second electrode plate of the second capacitor is connected to the second terminal of the light-emitting element, and a capacitance value of the second capacitor is greater than a capacitance value of the first capacitor.

10. The pixel circuit according to claim 1, further comprising a storage circuit, a first terminal of the storage circuit is connected to a second node, a second terminal of the storage circuit is connected to a third node, the control terminal of the driving circuit is connected to the second node, and the second terminal of the driving circuit is connected to the third node; and the second output terminal of the reset circuit is connected to the third node.

11. The pixel circuit according to claim 1, wherein the data writing circuit comprises a data writing transistor, a gate electrode of the data writing transistor is connected to a first control signal line to receive the first control signal, a first electrode of the data writing transistor is connected to the data line to receive a data signal, and a second electrode of the data writing transistor is connected to the first node.

12. The pixel circuit according to claim 1, wherein the reset circuit comprises a third reset transistor, a gate electrode of the third reset transistor is connected to a second control signal line to receive the second control signal, a first electrode of the third reset transistor is connected to a reset signal line to receive a reference signal, and a second electrode of the third reset transistor is the first output terminal.

13. The pixel circuit according to claim 1, wherein the first terminal of the light-emitting element is connected to the second terminal of the driving circuit.

14. A display device, comprising a display region and a peripheral region around the display region, wherein the display device comprises a plurality of sub-pixels in the display region, and at least part of the sub-pixels respectively comprise the pixel circuit according to claim 1; and display device further comprises a plurality of partition control signal lines, the display region comprises a plurality of sub-regions, and partition control circuits of sub-pixels in at least two sub-regions are electrically connected to different partition control signal lines.

15. The display device according to claim 14, further comprising:

a circuit board in the peripheral region;
a gate driving circuit structure in the peripheral region;
a plurality of data lines arranged along a first direction; and
a plurality of first control signal lines arranged along a second direction, the second direction intersecting with the first direction,
wherein the circuit board is configured to provide partition control signals for the partition control signal lines, the circuit board is further configured to provide data signals for the data lines, and the gate driving circuit structure is configured to provide first control signals for the first control signals.

16. The display device according to claim 15, wherein the plurality of partition control signal lines comprise a plurality of first partition control signal lines and a plurality of second partition control signal lines, at least one of the plurality of first partition control signal lines extends along the first direction, at least one of the plurality of second partition control signal lines extends along the second direction, and one first partition control signal line is electrically connected to the circuit board through at least one second partition control signal line; and control terminals of partition control circuits of sub-pixels in a same sub-region are electrically connected to a same first partition control signal line, and are insulated from different first partition control signal lines electrically connected to sub-pixels in different sub-regions.

17. The display device according to claim 15, wherein the second output terminal of the reset circuit is connected to the first terminal of the driving circuit.

18. The display device according to claim 17, wherein the partition control circuit comprises a partition control transistor, the reset circuit comprises a first reset transistor, and in a same sub-pixel, a gate electrode of the partition control transistor and a gate electrode of the first reset transistor is electrically connected to a same partition control signal line to receive the partition control signal; and at least two sub-pixels share a same first reset transistor.

19. The display device according to claim 17, wherein at least two sub-pixels share a same light-emitting control circuit.

20. A driving method for the pixel circuit according to claim 1, comprising a reset phase, a compensation phase, a data writing phase and a light-emitting phase, wherein in the reset phase, inputting the second control signal, the partition control signal and the third control signal to turn on the reset circuit and the partition control circuit, to reset the control terminal of the driving circuit and reset one terminal, connected to the second output terminal of the reset circuit, of the first terminal and the second terminal of the driving circuit;

in the compensation phase, inputting the second control signal, the light-emitting control signal and the partition control signal to keep turning on the reset circuit, the partition control circuit and the driving circuit and turn on the light-emitting control circuit, to compensate the second terminal of the driving circuit through a voltage of the first voltage terminal;

in the data writing phase, inputting the first control signal and the partition control signal, to keep turning on the partition control circuit and turn on the data writing circuit, to apply the data voltage to the control terminal of the driving circuit; and in the light-emitting phase, inputting the light-emitting control signal and the partition control signal, to keep turning on the partition control circuit and turn on the light-emitting control circuit and the driving circuit, to generate a driving current, and drive the light-emitting element to emit light.

* * * * *